(12) United States Patent
Xi et al.

(10) Patent No.: US 10,790,225 B1
(45) Date of Patent: Sep. 29, 2020

(54) CHIP PACKAGE STRUCTURE AND CHIP PACKAGE METHOD INCLUDING BARE CHIPS WITH CAPACITOR POLAR PLATE

(71) Applicant: Shanghai AVIC OPTO Electronics Co., Ltd., Shanghai (CN)

(72) Inventors: Kerui Xi, Shanghai (CN); Feng Qin, Shanghai (CN); Jine Liu, Shanghai (CN); Xiaohe Li, Shanghai (CN); Tingting Cui, Shanghai (CN); Xuhui Peng, Shanghai (CN)

(73) Assignee: SHANGHAI AVIC OPTO ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/441,243

(22) Filed: Jun. 14, 2019

(30) Foreign Application Priority Data

Mar. 29, 2019 (CN) .......................... 2019 1 0252794

(51) Int. Cl.
*H01L 23/522* (2006.01)
*H01L 23/31* (2006.01)
(Continued)

(52) U.S. Cl.
CPC ........ *H01L 23/5223* (2013.01); *H01L 21/565* (2013.01); *H01L 23/3121* (2013.01);
(Continued)

(58) Field of Classification Search
CPC . H01L 23/5223; H01L 28/60; H01L 23/5283; H01L 23/3121; H01L 25/16; H01L 21/565
See application file for complete search history.

(56) References Cited

U.S. PATENT DOCUMENTS 6,777,777 B1 * 8/2004 Kar-Roy ............. H01L 23/5223
257/310
2010/0078783 A1 * 4/2010 Otremba ............... H01L 25/115
257/676
(Continued)

FOREIGN PATENT DOCUMENTS

CN 1463043 A 12/2003
CN 206076221 A 4/2017

*Primary Examiner* — John P. Dulka
(74) *Attorney, Agent, or Firm* — Anova Law Group PLLC

(57) ABSTRACT

Chip package structure and chip package method are provided. The chip package structure includes an encapsulating layer, a first metal layer, a second metal layer, and bare chips. The bare chips include first bare chips and second bare chips. First-connecting-posts are formed on a side of the first bare chips and on a side of the second bare chips. The encapsulating layer covers the bare chips and the first-connecting-posts. The first metal layer is disposed on the side of the first-connecting-posts away from the bare chips and includes first capacitor polar plates and conductive parts. The first capacitor polar plates are electrically connected to the first-connecting-posts on the first bare chips, and the conductive parts are electrically connected to the first-connecting-posts on the second bare chips. The second metal layer is disposed on a side of the first metal layer away from the encapsulating layer and includes second capacitor polar plates electrically connected to the conductive parts.

18 Claims, 18 Drawing Sheets

(51) Int. Cl.
*H01L 21/56* (2006.01)
*H01L 49/02* (2006.01)
*H01L 25/16* (2006.01)
*H01L 23/528* (2006.01)

(52) U.S. Cl.
CPC .......... *H01L 23/5283* (2013.01); *H01L 25/16* (2013.01); *H01L 28/60* (2013.01)

(56) References Cited

U.S. PATENT DOCUMENTS

| | | | |
|---|---|---|---|
| 2011/0059593 A1* | 3/2011 | Xue | H01L 27/0688 |
| | | | 438/396 |
| 2012/0153448 A1* | 6/2012 | Ihara | H01L 21/76838 |
| | | | 257/675 |
| 2012/0199948 A1* | 8/2012 | Saisse | H01L 23/5223 |
| | | | 257/532 |
| 2013/0277800 A1* | 10/2013 | Hori | H01G 4/40 |
| | | | 257/532 |
| 2017/0077068 A1* | 3/2017 | Horio | H01L 23/492 |
| 2020/0135668 A1* | 4/2020 | Iwasaki | H01L 23/642 |

\* cited by examiner

US 10,790,225 B1

CHIP PACKAGE STRUCTURE AND CHIP PACKAGE METHOD INCLUDING BARE CHIPS WITH CAPACITOR POLAR PLATE

CROSS-REFERENCES TO RELATED APPLICATION

This application claims the priority of Chinese Patent Application No. 201910252794.3, filed on Mar. 29, 2019, the content of which is incorporated herein by reference in its entirety.

TECHNICAL FIELD

The present disclosure generally relates to the field of chip package technology and, more particularly, relates to a chip package structure and a chip package method.

BACKGROUND

As information technologies and semiconductor technologies develop, smart electronic products such as cell phones and computers become smaller and their functions are integrated with each other, posing an unprecedented challenge to an integration level of circuits in electronic products.

SUMMARY

One aspect of the present disclosure provides a chip package structure. The structure includes: an encapsulating layer, a first metal layer, a second metal layer, and a plurality of bare chips. The plurality of bare chips includes at least one first bare chip and at least one second bare chip. First-connecting-posts are formed on a side of the plurality of bare chips. The first connecting-posts include at least one first first-connecting-post on a side of the at least one first bare chip and at least one second first-connecting-post on a side of the at least one second bare chip. The encapsulating layer covers the plurality of bare chips and the first-connecting-posts, while exposes a side of the first-connecting-posts away from the plurality of bare chips. The first metal layer is disposed on the side of the first-connecting-posts away from the plurality of the bare chips, and includes at least one first capacitor polar plate and at least one conductive part. The at least one first capacitor polar plate is electrically connected to the at least one first first-connecting-post on the at least one first bare chip, and the at least one conductive part is electrically connected to the at least one second first-connecting-post on the at least one second bare chip. The second metal layer is disposed on a side of the first metal layer away from the encapsulating layer, and includes at least one second capacitor polar plate electrically connected to the at least one conductive part. Along a direction perpendicular to a plane of the plurality of bare chips, an orthographic projection of the at least one first capacitor polar plate at least partially overlaps an orthographic projection of the at least one second capacitor polar plate.

Another aspect of the present disclosure provides a chip package method. The method includes: providing a base substrate; providing a plurality of bare chips attached to the base substrate and including at least one first bare chip and at least one second bare chip; forming first-connecting-posts on a side of the plurality of bare chips, where the first-connecting-posts include at least one first first-connecting-post on a side of the at least one first bare chip and at least one second first-connecting-post on a side of the at least one second bare chips; forming an encapsulating layer to cover the plurality of bare chips and the first-connecting-posts; polishing the encapsulating layer to expose a side of the first-connecting-posts away from the plurality of bare chips; forming a first metal layer on the side of the first-connecting-posts away from the plurality of bare chips; forming a second metal layer on a side of the first metal layer away from the encapsulating layer; and lifting off the base substrate. The second metal layer includes at least one second capacitor polar plate electrically connected to the at least one conductive part. Along a direction perpendicular to a plane of the plurality of bare chips, an orthographic projection of the at least one first capacitor polar plate at least partially overlaps an orthographic projection of the at least one second capacitor polar plate. The first metal layer includes at least one first capacitor polar plate and at least one conductive part. The at least one first capacitor polar plate is electrically connected to the at least one first first-connecting-post on the at least one first bare chip and the at least one conductive part is electrically connected to the at least one second first-connecting-post on the at least one second bare chip.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
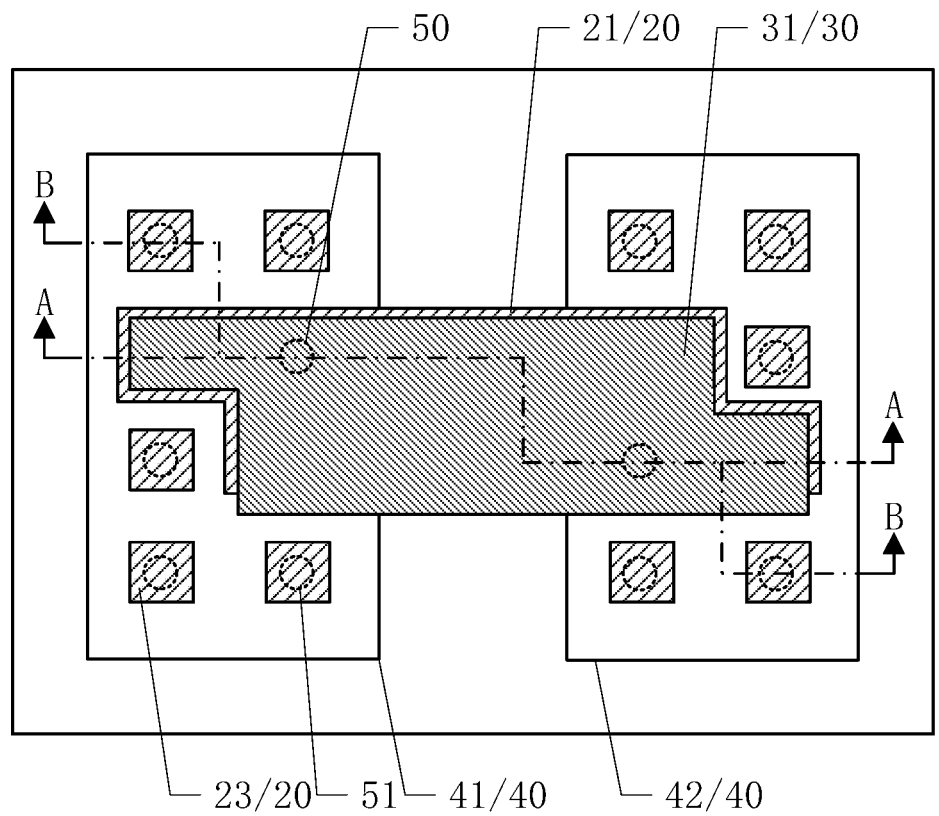
FIG. 1 illustrates a planar structure of an exemplary chip package structure consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not fol low the common proportion and may be partially exaggerated. Besides, those schematic diagrams are merely examples, and not intended to limit the scope of the disclosure. Furthermore, a three-dimensional (3D) size including length, width and depth should be considered during practical fabrication.

Figure 2:
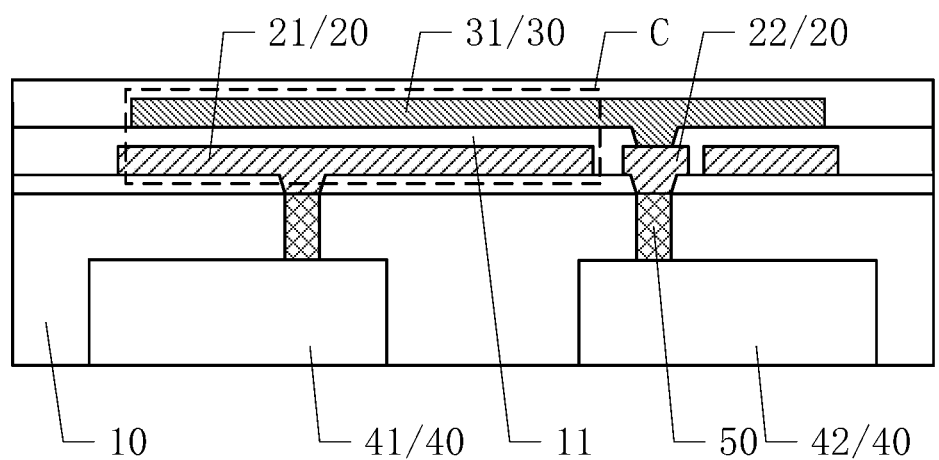
FIG. 2 illustrates a cross-section view of the chip package structure in FIG. 1 along an A-A direction consistent with various disclosed embodiments in the present disclosure.
Figure 3:
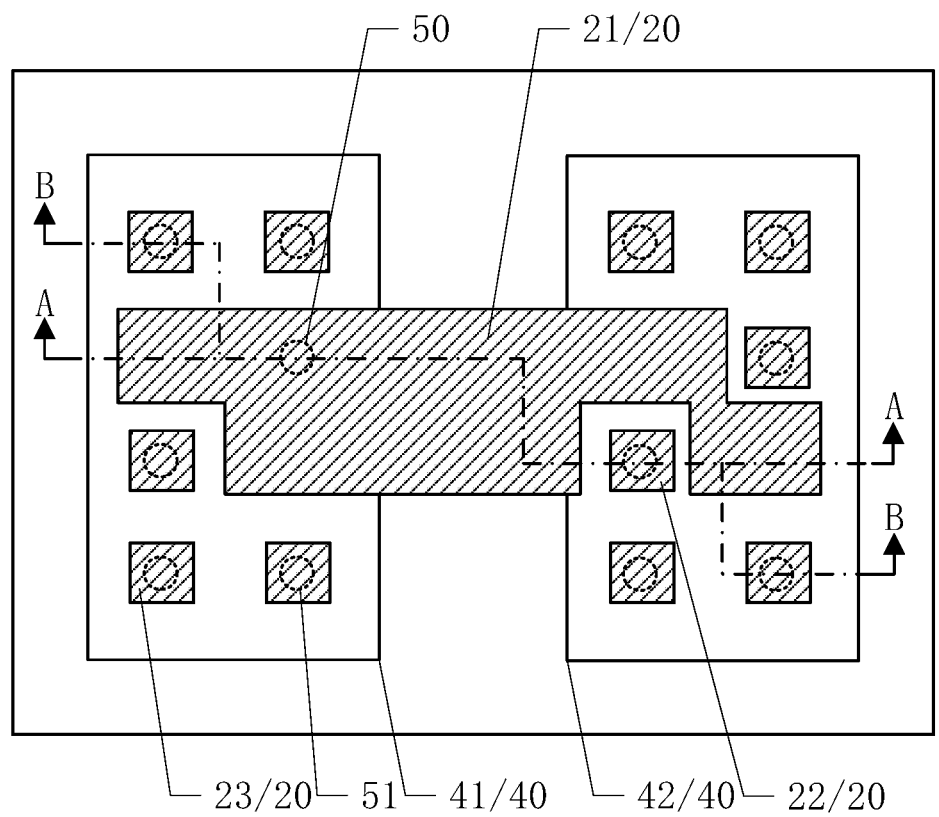
FIG. 3 illustrates a planar structure of the chip package structure in FIG. 1 with a first metal layer consistent with various disclosed embodiments in the present disclosure.

As illustrated in FIGS. 1-3, one embodiment of the present disclosure provides a chip package structure. The chip package structure may include an encapsulating layer 10, a first metal layer 20, a second metal layer 30, and a plurality of bare chips 40.

The plurality of bare chips 40 may include at least one first bare chip 41 and at least one second bare chip 42. First-connecting-posts 50 may be formed on the plurality of bare chips 40. The first-connecting-posts 50 may include at least one first first-connecting-post 50 at a side of the at least one first bare chip 41 and at least one second first-connecting-post 50 at a side of the at least one second bare chip 42. The encapsulating layer 10 may cover the plurality of bare chips 40 and the first-connecting-posts 50, but expose a side of the first-connecting-posts 50 away from the plurality of bare chips 40.

The first metal layer 20 may be disposed at the side of the first connecting posts 50 away from the plurality of bare chips 40, and may include at least one first capacitor polar plate 21 and at least one conductive part 22. The at least one first capacitor polar plate 21 may be electrically connected to the first first-connecting-post 50 on the at least one first bare chip 41, and the at least one conductive part 22 may be electrically connected to the second first-connecting-post 50 on the at least one second bare chip 42. The second metal layer 30 may be disposed at a side of the first metal layer 20 away from the encapsulating layer 10, and may include at least one second capacitor polar plate 31 electrically connected to the at least one conductive part 22. Along a direction perpendicular to a plane of the plurality of bare chips 40, an orthographic projection of the at least one first capacitor polar plate 21 may at least partially overlap an orthographic projection of the at least one second capacitor polar plate 31.

In the present disclosure, the plurality of bare chips may be disposed in the chip package structure. Correspondingly, the plurality of bare chips may be packaged together to improve an integration level of the chip package structure. A size, a quantity, and functions of the plurality of bare chips may be configured according to actual needs. For description purposes only, the embodiment with a chip package structure in FIG. 1 is used as an example to illustrate the present disclosure, and should not limit the scope of the present disclosure.

Figure 10:
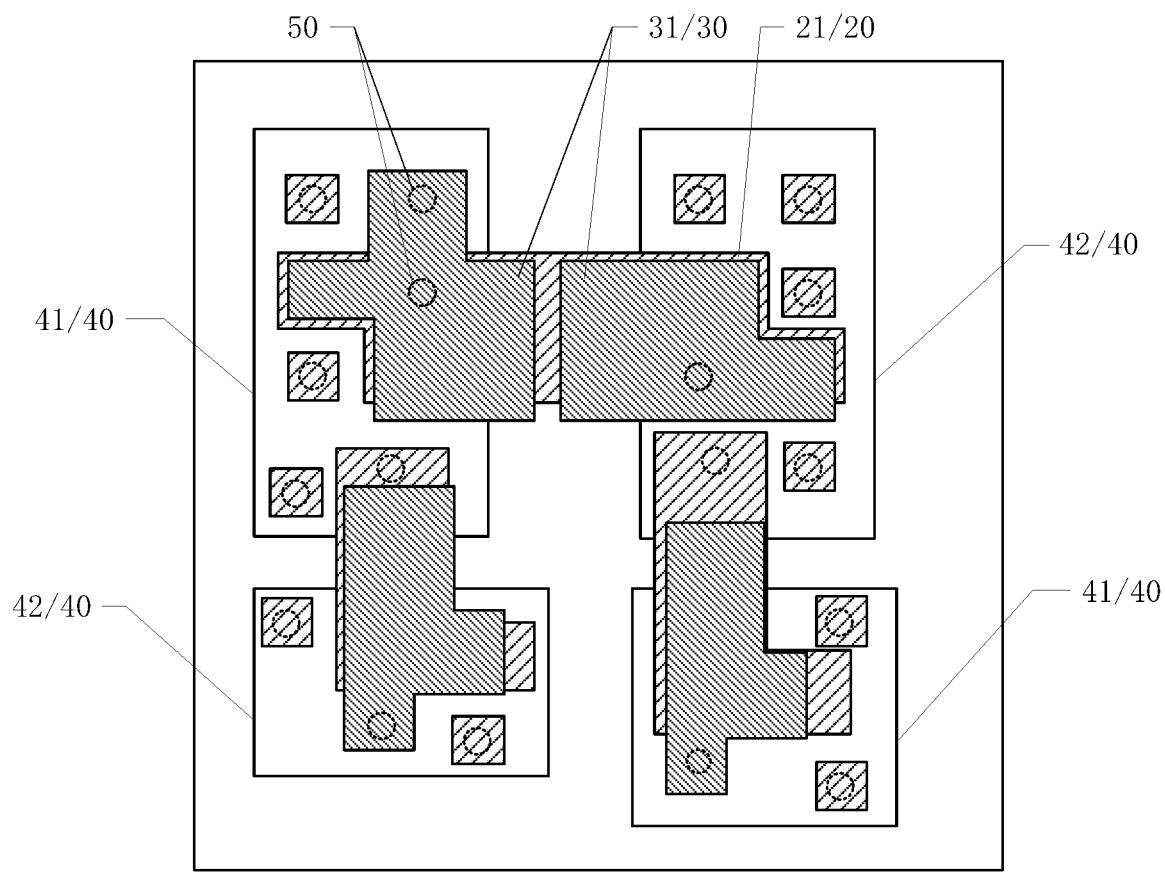
FIG. 10 illustrates a planar structure of another exemplary chip package structure consistent with various disclosed embodiments in the present disclosure.

In one embodiment, two bare chips 40 may be disposed in the chip package structure. The two bare chips 40 may include a first bare chip 41 and a second bare chip 42. At least one first first-connecting-post 50 may be disposed on one side of the first bare chip 41 and at least one second first-connecting-post 50 may be formed on one side of the second bare chip 42. Correspondingly, the two bare chips 40 may transmit signals through the first-connecting-posts 50. The first-connecting-posts 50 may be made of materials with a good electrical conductivity including copper, silver, and/ or gold, to suppress a loss of the signals in the first-connecting-posts 50. In some other embodiments, the first-connecting-posts 50 may be block soldering pad structures. For description purposes only, the embodiment with a chip package structure in FIG. 1 where the plurality of bare chips includes a first bare chip and a second bare chip is used as an example to illustrate the present disclosure, and should not limit the scope of the present disclosure. In various embodiments, the chip package structure may include any suitable number of first bare chips and any suitable number of second bare chips, for example, two first bare chips and two second bare chips (shown in FIG. 10).

The encapsulating layer 10 may cover the plurality of bare chips 40 and the first-connecting-posts 50, and may expose a side surface of the first-connecting-posts 50 away from the plurality of bare chips 40. The encapsulating layer 10 may be made of plastic materials with a good sealing capability such as an epoxy molding compound (EMC). Correspondingly, the plurality of bare chips 40 and the first-connecting-posts 50 may be plastically sealed and protected by the encapsulating layer 10. Also, metal layers to be formed on the encapsulating layer 10 subsequently may be flat and may be not easily broken. A reliability of connections between wires in the metal layers may be improved. For description purposes only, the embodiment with a chip package structure in FIG. 1 where a side surface of the plurality of bare chips 40 away from the first-connecting-posts 50 is covered by the encapsulating layer 10 is used as an example to illustrate the present disclosure, and should not limit the scope of the present disclosure. In various embodiments, the one side surface of the plurality of bare chips 40 away from the first-connecting-posts 50 may be or may not be covered by the encapsulating layer 10.

The first metal layer 20 and the second metal layer 30 may be disposed on the encapsulating layer 10 sequentially. An interlayer insulation between the first metal layer 20 and the second metal layer 30, and an interlayer insulation between the first metal layer 20 and the encapsulating layer 10, may be realized by the insulating layer 11. In the first metal layer, the first capacitor polar plate 21 and the conductive part 22 may be electrically connected to the first first-connecting-post 50 on the first bare chip 41 and to the second first-connecting-post 50 on the second bare chip 42 respectively. The second capacitor polar plate 31 in the second metal layer 30 may be electrically connected to the conductive part 22. Correspondingly, the first capacitor polar plate 21 and the second capacitor polar plate 31 may be electrically connected to the two bare chips 40 through the first-connecting-posts 50 respectively.

The orthographic projection of the first capacitor polar plate 21 on the plane of the bare chips 40 may overlap the orthographic projection of the second capacitor polar plate 31 on the plane of the bare chips 40. Correspondingly, the first capacitor polar plate 21, the second capacitor polar plate 31, and a portion of the insulating layer 11 between the first capacitor polar plate 21 and the second capacitor polar plate 31 may together form a capacitor structure C. The capacitor structure C in the circuit may have functions including voltage stabilization, voltage boosting, filtering, charging/discharging, rectification, and/or oscillation, after it is connected to the circuit. Correspondingly, the chip package structure may have multiple IC and capacitor functions. The capacitor structure C may be disposed between the two bare chips 40. Correspondingly, a space between a side of the bare chips 40 with the first-connecting-posts 50 and the bare chips 40 may be utilized effectively, and the capacitor structure C may not occupy Extra space in the chip package structure. The integration level of the chip package structure may be improved to adapt to the miniaturization of the electronic products. Production efficiency of electronic products may be improved. The capacitor structure C may be packaged together with the bare chips 40 by an electrical fan-out wiring method. An effective connection between the capacitor structure C and the first-connecting-posts 50 may be guaranteed, and a reliability of the chip package structure may be improved. For description purposes only, dash lines in FIG. 2 show a part of the capacitor structure and should not limit the scopes of the present disclosure. In various embodiments, an area of the overlapping region between the orthographic projection of the first capacitor polar plate 21 and the orthographic projection of the second capacitor polar plate 31 on the plane of the bare chips 40 may be any suitable size configured according to actual needs.

In the present disclosure, there may be no need to wire out the capacitor structure C by a ball implantation. Correspondingly, the first capacitor polar plate 21 and the second capacitor polar plate 31 may be only electrically connected to the first-connecting-posts 50 in the chip package structure, and the bare chips 40 may provide signals to the capacitor structure C through the first-connecting-posts 50. An assembly of the chip package structure and external circuits such as PCB boards may be simplified, the reliability of the chip package structure and the good production ratio of the electronic products may be improved. Compared with a package method where chips and capacitors are soldered with external circuits such as PCB boards through the ball implantation, there may be no need to wire out the capacitor structure C in the present disclosure by a ball implantation. A number of the ball implantation and a wire length between the bare chips and the capacitors may be reduced. Correspondingly, an energy cost of the electronic products may be reduced.

For description purposes only, other film layer structures are not shown in FIGS. 1-3. In various embodiments, the first metal layer 20 and the second metal layer 30 may be made of a same material of different materials. A capacitor structure C may be disposed between any two bare chips 40 in the chip package structure. The chip package structure may include one or more capacitor structures C based on the above structure relationships. A number of the first-connecting-posts 50 may be configured according to the number of the capacitor structures C.

In the present disclosure, the chip package structure may include the first capacitor polar plate and the second capacitor polar plate. The orthographic projection of the first capacitor polar plate may overlap the orthographic projection of the second capacitor polar plate, to form the capacitor structure. The first capacitor polar plate and the second capacitor polar plate may be formed when packaging the plurality of bare chips, and the capacitor structure and the plurality of bare chips may be packaged together. The assembly of the chip package structure may be simplified and the production efficiency of the electronic products may be improved. The capacitor structure may be disposed between the first bare chip and the second bare chips. Correspondingly, a space between a space of the bare chips and a space between the bare chips may be utilized effectively. The integration level of the chip package structure may be improved. The bare chips may provide signals to the capacitor structure through the first-connecting-posts without external capacitors, and there may be no need to wire out the capacitor structure by a ball implantation method. The chip package structure may have one or more functions of voltage stabilization, voltage boosting, filtering, charging/discharging, rectification, and oscillation. The first-connecting-posts on the bare chips may use the electrical fan-out wiring method. An effective connection between the first capacitor polar plate, the second capacitor polar plate, and the first-connecting-posts may be guaranteed. The reliability and the good product ratio of the chip package structure may be improved. The packaging process may be simplified and the cost of the electronic products may be reduced compared with a connection method where each chip is independently packaged and connected to an external capacitor.

Figure 4:
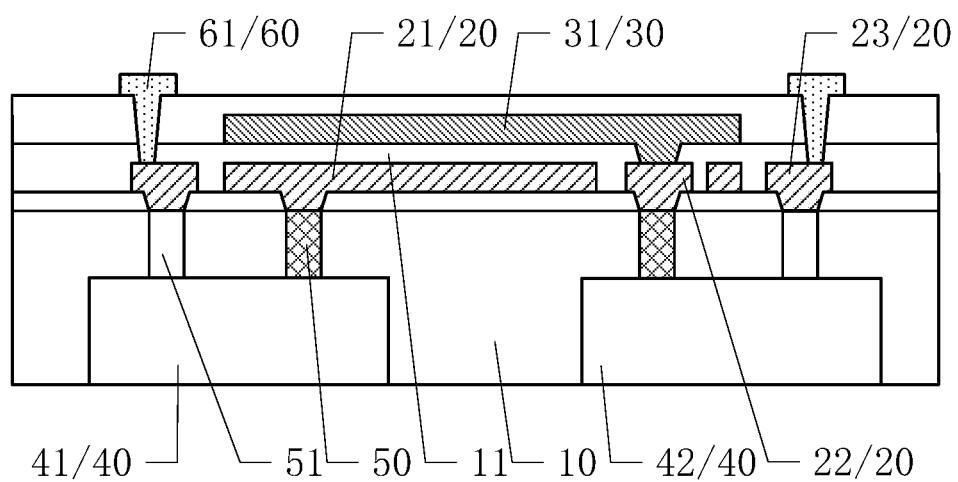
FIG. 4 illustrates a cross-section view of the chip package structure in FIG. 1 along a B-B direction consistent with various disclosed embodiments in the present disclosure.

In another embodiment illustrated in FIG. 1 and FIGS. 3-4, a plurality of second-connecting-posts 51 may be formed at a side of the first bare chip 41 and/or at a side of the second bare chip 42. The first metal layer 20 may further include at least one metal wire 23. The chip package structure may further include a third metal layer 60. The third metal layer 60 may include at least one connecting part 61. The at least one connecting part 61 may be electrically connected to the at least one metal wire 23. The at least one metal wire 23 may be electrically connected to the plurality of second-connecting-posts 51.

In the present embodiment, the third metal layer 60 may be disposed at a side of the second metal layer 30 away from the first metal layer 20. Correspondingly, the plurality of second-connecting-posts 51 at a side of the first bare chip 41 and/or at a side of the second bare chip 42 may be wired out through the at least one connecting part 61 to realize an electrical connection to the external circuits including the PCB boards. The third metal layer 60 may be formed by a method same as or different from a method to form the second metal layer 30 and the first metal layer 20. The third metal layer 60 may be formed by a method including an electrical plating method, a chemical plating method, and/or an etching method, as long as an electrical connection between the at least one connecting part 61 and the at least one metal wire 23 is guaranteed.

The plurality of second-connecting-posts 51 and the first-connecting-posts 50 may be formed in a same size and may be made of same materials. The packaging process may be simplified and the packaging efficiency may be improved. In various embodiments, when packaging a plurality of bare chips 40 with different size, a size and a material of each of the first-connecting-posts 50 and of each of the plurality of second-connecting-posts 51 may be adjusted suitably according to corresponding one of the plurality of bare chips 40.

In one embodiment illustrated in FIG. 4, the at least one connecting part 61 may include either one of a soldering ball and a soldering block. When the at least one connecting part 61 is a soldering ball, the third metal layer 60 may be made by a ball-implantation process. When the at least one connecting part 61 is a soldering block, the third metal layer 60 may be formed by an etching process. The third metal layer 60 may be made of metals including tin, lead, copper, silver, gold, and any combination thereof. Correspondingly, an electrical connection between the chip package structure and the external circuits such as a PCB board may be improved.

A number of the connecting parts 61 may be configured according to the actual needs. In one embodiment, all of the connecting parts 61 may be soldering balls or soldering blocks. In som other embodiments, a portion of the connecting parts 61 may be soldering balls, and another portion of the connecting parts 61 may be soldering blocks.

Figure 5:
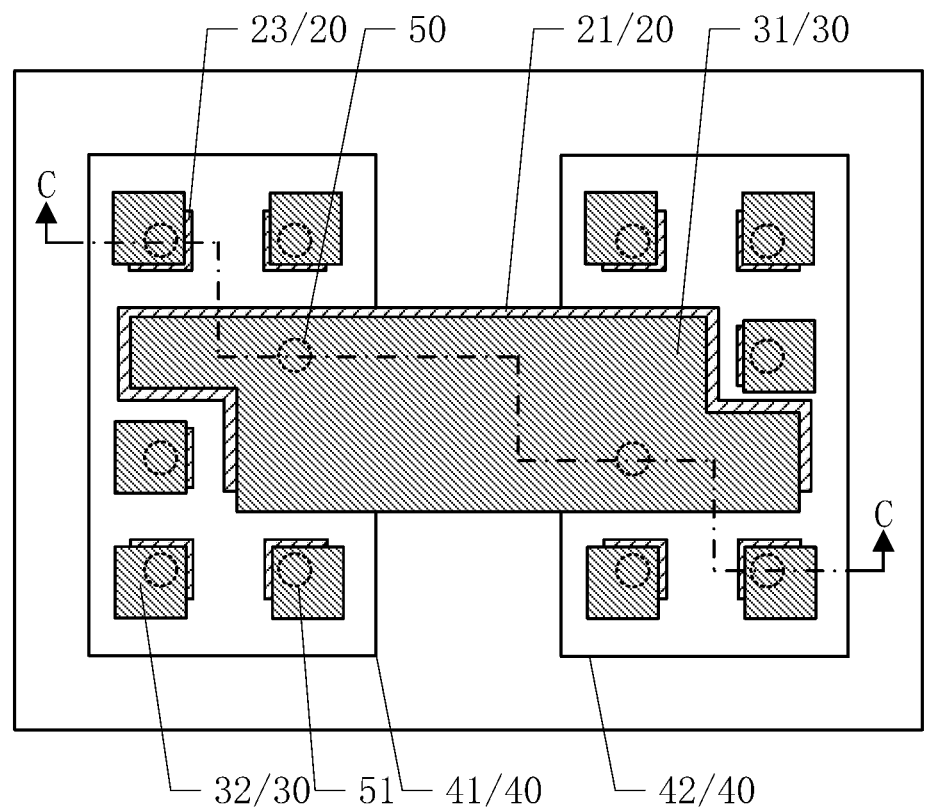
FIG. 5 illustrates a planar structure of another exemplary chip package structure consistent with various disclosed embodiments in the present disclosure.
Figure 6:
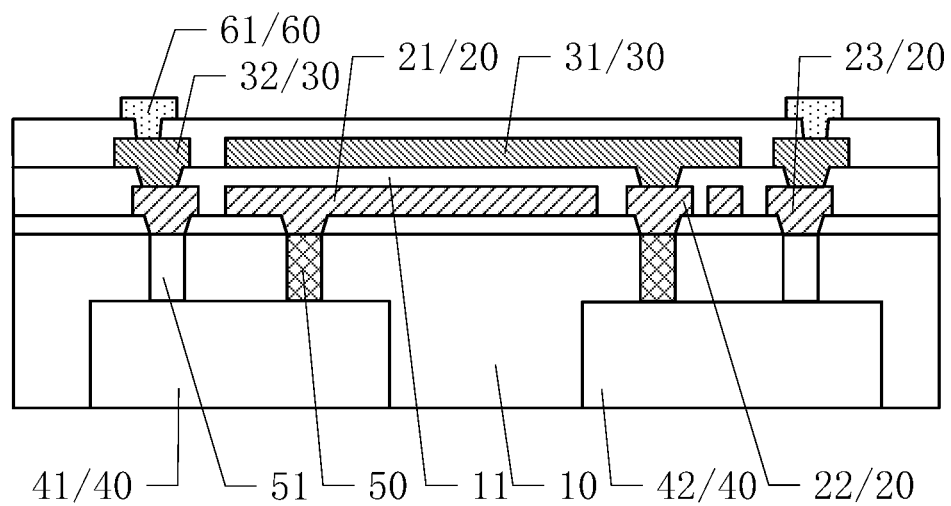
FIG. 6 illustrates a cross-section view of the chip package structure in FIG. 5 along a C-C direction consistent with various disclosed embodiments in the present disclosure.

In one embodiment illustrated in FIGS. 5-6, the second metal layer 30 may further include at least one second wire 32. The at least one connecting part 61 may be electrically connected to the at least one second wire 32 and the at least one second wire 32 may be electrically connected to the at least one first wire 23.

A planar view of the first metal layer 20 is illustrated in FIG. 3. The second metal layer 30 may further include at least one second wire 32. Correspondingly, when wiring out the plurality of second-connecting-posts 51 through the at least one connecting part 61, the at least one second wire 32 may be used as a transitional film layer between the at least one first wire 23 and the at least one connecting part 61. When forming the third metal layer 60 by the electrical plating or chemical plating method, a broken of the at least one connecting part 61 because of a large distance between different film layers may be effectively avoided, and a good product ratio of the chip package structure may be improved.

A number of the second connecting posts 51 on the first bare chip 41 and a number of the second connecting posts 51 on the second bare chip 42 may be configured according to actual needs. In one embodiment illustrated in FIG. 5, all of the plurality of second connecting posts 51 may be wired out through the film layer structure including the at least one first wire 23, the at least one second wire 32, and the at least one connecting part 61. In another embodiment, only a portion of the plurality of second connecting posts 51 may be wired out through the film layer structure including the at least one first wire 23, the at least one second wire 32, and the at least one connecting part 61. A remaining portion of the plurality of second connecting posts 51 may be wired out through the film layer structure including the at least one first wire 23 and the at least one connecting part 61.

Figure 7:
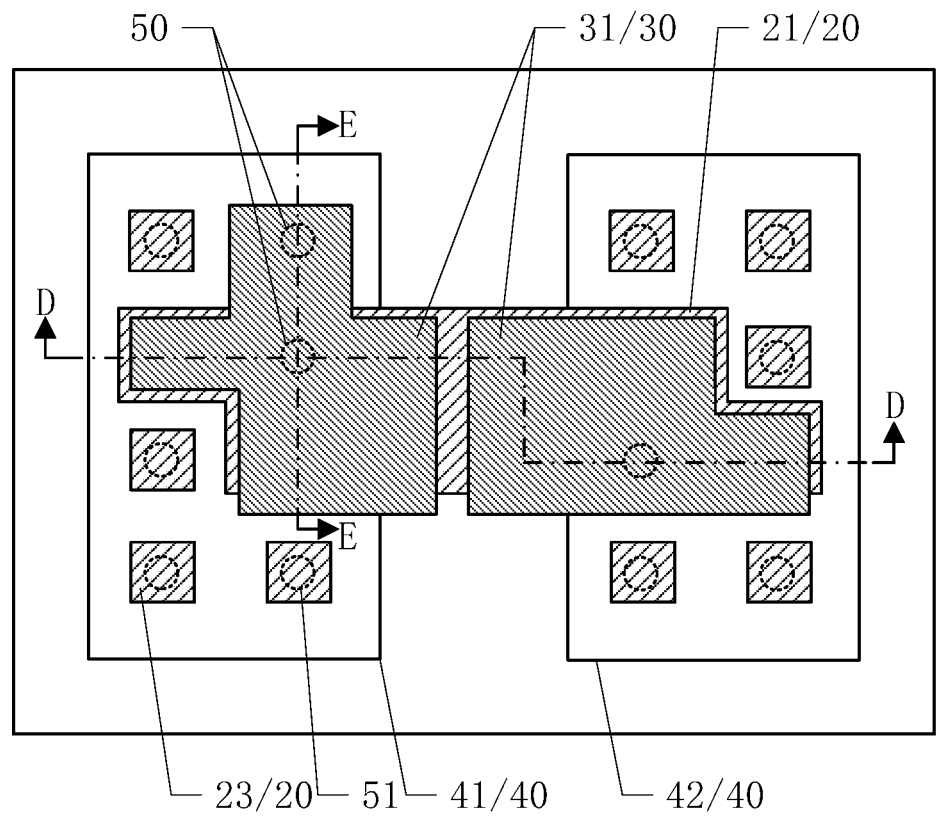
FIG. 7 illustrates a planar structure of another exemplary chip package structure consistent with various disclosed embodiments in the present disclosure.
Figure 8:
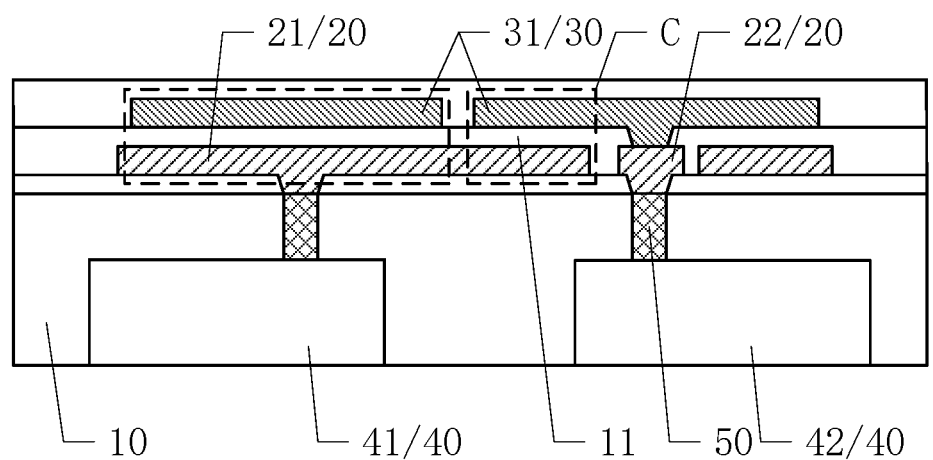
FIG. 8 illustrates a cross-section view of the chip package structure in FIG. 7 along a D-D direction consistent with various disclosed embodiments in the present disclosure.
Figure 9:
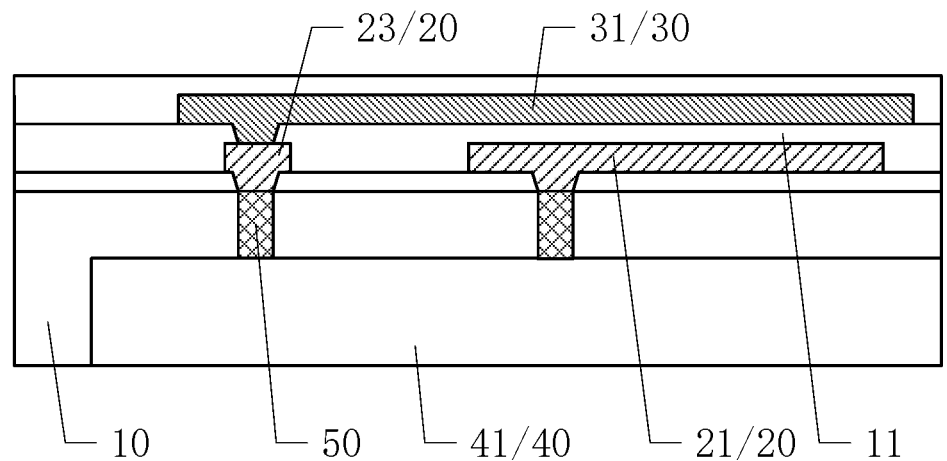
FIG. 9 illustrates a cross-section view of the chip package structure in FIG. 7 along an E-E direction consistent with various disclosed embodiments in the present disclosure.

In one embodiment illustrated in FIGS. 7-9, the second metal layer 30 may include at least two second capacitor polar plates 31. Along a direction perpendicular to the plane of the plurality of bare chips 40, an orthographic projection of the at least two second capacitor polar plates 31 may overlap the orthographic projection of the first capacitor polar plate 21.

For description purposes only, the embodiment in FIGS. 7-8 where the second metal layer 30 includes two second capacitor polar plates 31 is used as an example to illustrate the present disclosure, and should not limit the scopes of the present disclosure. In various embodiments, the second metal layer 30 may include two or more second capacitor polar plates 31 according to the actual needs.

In one embodiment illustrated in FIGS. 7-8, along the direction perpendicular to the plane of the plurality of bare chips 40, the orthographic projection of the two second capacitor polar plates 31 may overlap the orthographic projection of the first capacitor polar plate 21. Correspondingly, each of the two second capacitor polar plates 31 may form a capacitor structure C with the first capacitor polar plate 21 and the insulating layer 11. The chip package structure may have multiple IC and capacitor functions. In various embodiments, an overlapping area between each of the two second capacitor polar plates 31 and the first capacitor polar plate 21 may be same, partially same, or totally different, to improve a space utilization efficiency of the film layer of the second metal layer 30.

In some other embodiments, the first metal layer 20 may include at least two first capacitor polar plates 21 when the space of the film layer of the first metal layer 20 is enough. Along the direction perpendicular to the plane of the plurality of bare chips 40, an orthographic projection of the at least two first capacitor polar plates 21 may overlap the orthographic projection of the same one of the two second capacitor polar plates 31.

For description purposes only, other film layer structures are not shown in FIGS. 7-9. In one embodiment, the two second capacitor polar plates 31 may be electrically connected to the first-connecting-post 50 on a same bare chip 40. In another embodiment, one of the second capacitor polar plates 31 may be electrically connected to the firstconnecting-post 50 on the first bare chip 41, and another second capacitor polar plate 31 may be electrically connected to the first-connecting-post 50 on the second bare chip 42, as illustrated in FIGS. 7-9. The two second capacitor polar plates 31 may be electrically connected to the first-connecting-posts 50 through the conductive part 22 or the at least one first wire 23.

Figure 11:
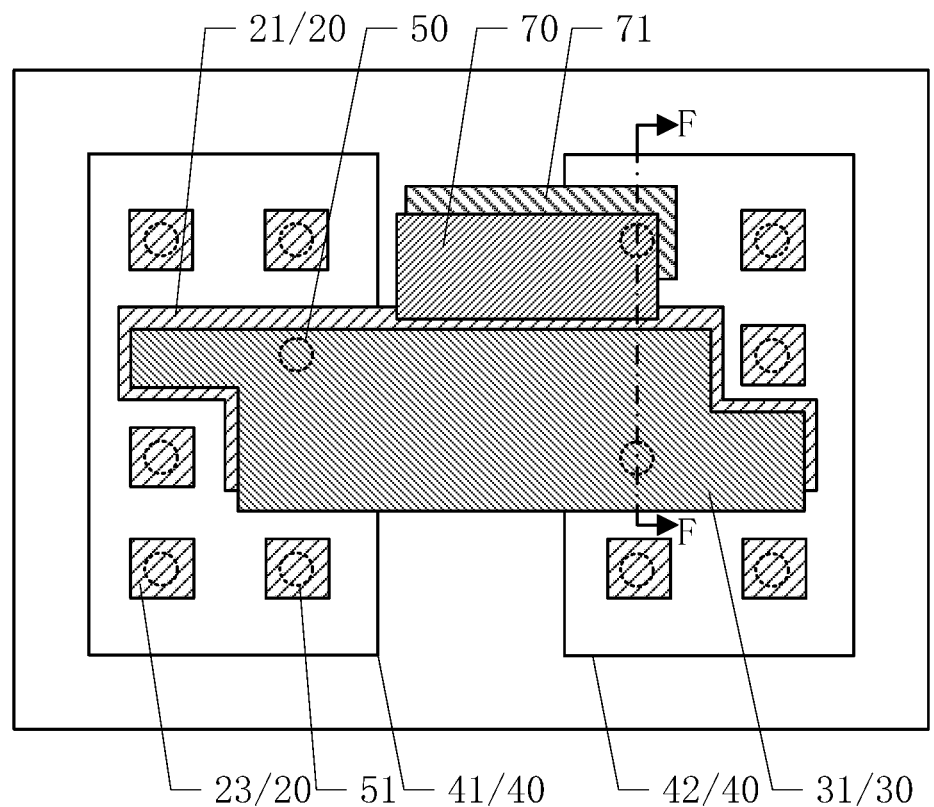
FIG. 11 illustrates a planar structure of another exemplary chip package structure consistent with various disclosed embodiments in the present disclosure.
Figure 12:
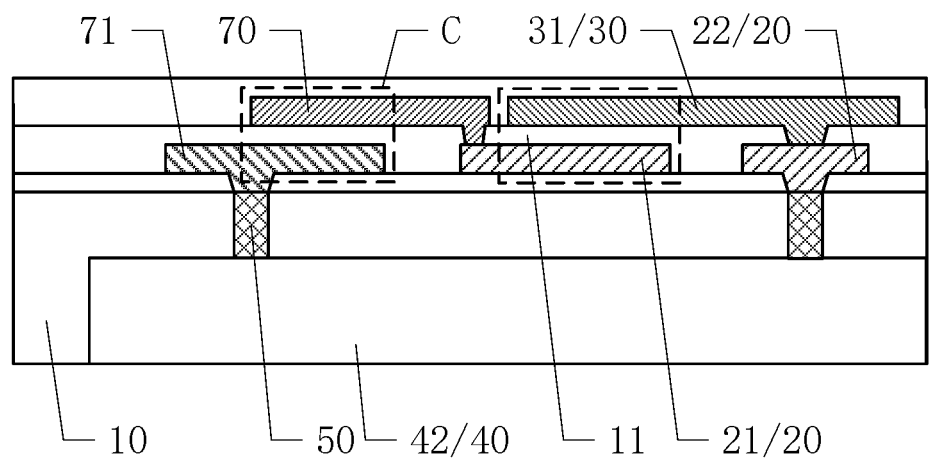
FIG. 12 illustrates a cross-section view of the chip package structure in FIG. 10 along an F-F direction consistent with various disclosed embodiments in the present disclosure.
Figure 13:
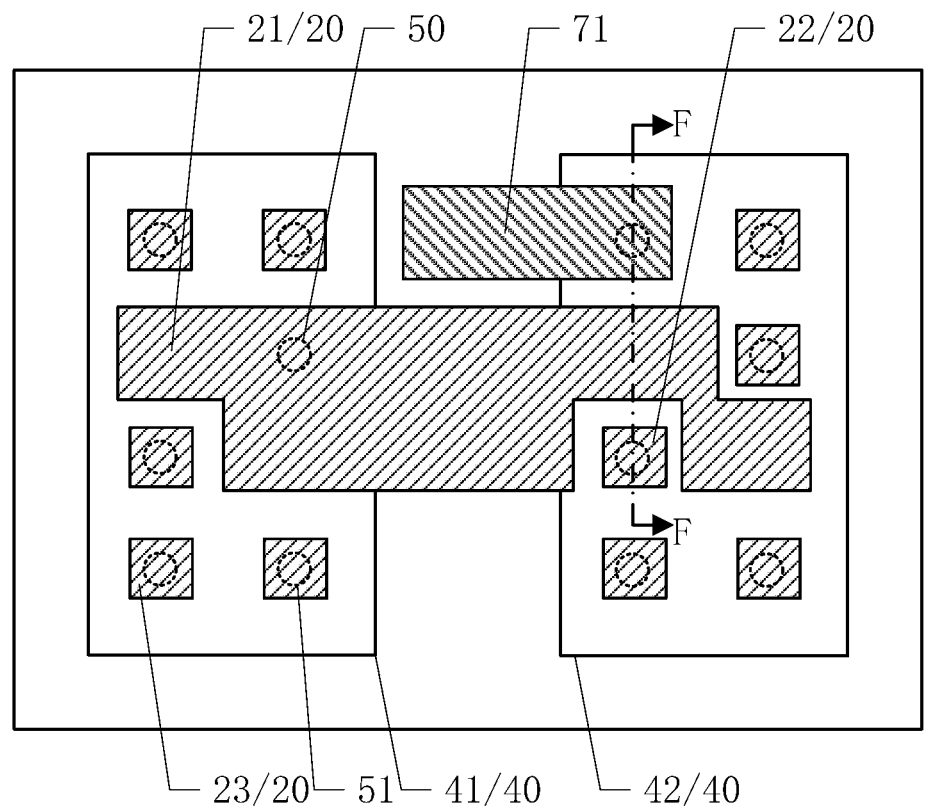
FIG. 13 illustrates a planar structure of the chip package structure in FIG. 11 with a first metal layer consistent with various disclosed embodiments in the present disclosure.

In one embodiment illustrated in FIGS. 11-13, the chip package structure may further include at least one third capacitor polar plate 70 and at least one fourth capacitor polar plate 71. The at least one third capacitor polar plate 70 and the at least one fourth capacitor polar plate 71 may be disposed in different layers. The at least one third capacitor polar plate 70 may be electrically connected to the first capacitor polar plate 21 and may be disposed in a layer different from the first capacitor polar plate 21. Along the direction perpendicular to the plane of the plurality of bare chips 40, the orthographic projection of the at least one third capacitor polar plates 70 may overlap the orthographic projection of the at least one fourth capacitor polar plate 71.

In one embodiment of the present disclosure, the at least one third capacitor polar plate 70 and the at least one fourth capacitor polar plate 71 may be disposed in different layers, and the orthographic projection of the at least one third capacitor polar plates 70 may overlap the orthographic projection of the at least one fourth capacitor polar plate 71 along the direction perpendicular to the plane of the plurality of bare chips 40. Correspondingly, the at least one third capacitor polar plate 70, the at least one fourth capacitor polar plate 71, and a portion of the insulating layer 11 between the at least one third capacitor polar plate 70 and the at least one fourth capacitor polar plate 71 may together form capacitor structures C. The at least one first capacitor polar plate 21 and the at least one second capacitor polar plate 31 may also form capacitor structures C. Correspondingly, the chip package structure may have at least two capacitor structures C formed by the at least one first capacitor polar plate 21, the at least one second capacitor polar plate 31, the at least one third capacitor polar plate 70 and the at least one fourth capacitor polar plate 71. The chip package structure may have functions including voltage stabilization, voltage boosting, filtering, charging/discharging, rectification, and/or oscillation.

The at least one third capacitor polar plate 70 may be electrically connected to the at least one first capacitor polar plate 21 and the at least one first capacitor polar plate 21 may be electrically connected to the first-connecting-post 50 on the first bare chips 41. Correspondingly, the at least one third capacitor polar plate 70 may get signals through the first-connecting-posts 50. A portion of the at least one third capacitor polar plate 70 may be configured according to actual needs as long as the at least one third capacitor polar plate 70 and the at least one first capacitor polar plate 21 are disposed in different layers.

The at least one fourth capacitor polar plate 71 may be connected in the chip package structure according to actual needs. In one embodiment illustrated in FIGS. 11-13, the at least one fourth capacitor polar plate 71 may be electrically connected to the first-connecting-post 50 on the second bare chip 42, and then may get signals through the first-connecting-post 50. In another embodiment, the at least one fourth capacitor polar plate 71 may be wired out through the connecting part 61 similar to the first wire 23 in FIG. 4.

In one embodiment illustrated in FIGS. 11-13, the at least one fourth capacitor polar plate 71 and the at least one second capacitor polar plate 31 may be disposed in a same layer, while the at least one fourth capacitor polar plate 71 and the at least one first capacitor polar plate 21 may be disposed in another same layer. Correspondingly, the at least one fourth capacitor polar plate 71 and the at least one first capacitor polar plate 21 may be formed simultaneously when forming the first metal layer 20, while the at least one fourth capacitor polar plate 71 and the at least one second capacitor polar plate 31 may be formed simultaneously when forming the second metal layer 30. The chip package process may be simplified and the package efficiency of the chip package structure may be improved. A space utilization efficiency of the film layers where the first metal layer 20 and the second metal layer 30 are disposed respectively may be improved and an arrangement of wires in the metal layers may be more flexible.

Figure 14:
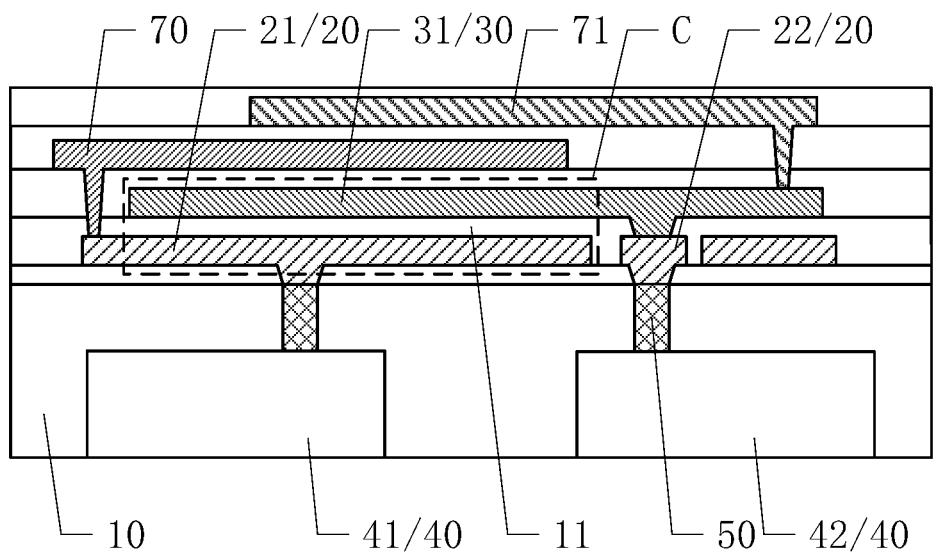
FIG. 14 illustrates another cross-section view of the chip package structure in FIG. 1 along the A-A direction consistent with various disclosed embodiments in the present disclosure.

In another embodiment illustrated in FIG. 1 and FIG. 14, the at least one first capacitor polar plate 21, the at least one second capacitor polar plate 31, the at least one third capacitor polar plate 70, and the at least one fourth capacitor polar plate 71 may be disposed in different layers. The at least one second capacitor polar plate 31 may be electrically connected to the at least one fourth capacitor polar plate 71.

Figure 15:
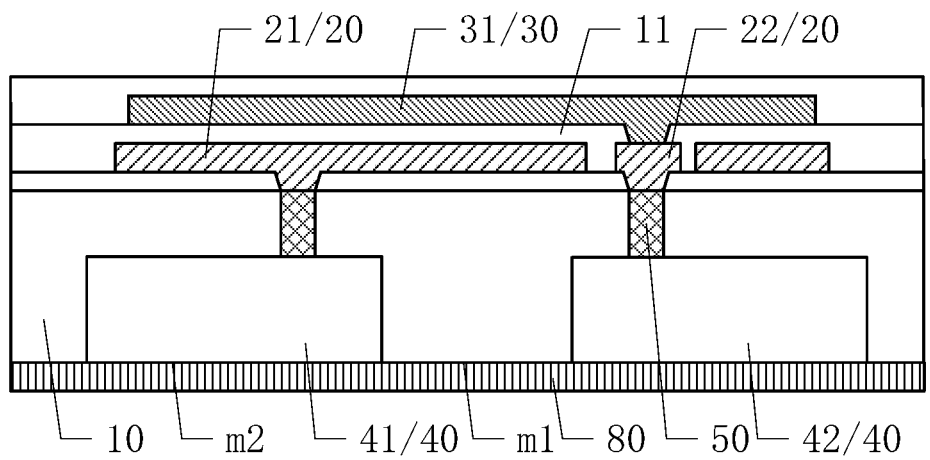
FIG. 15 illustrates another cross-section view of the chip package structure in FIG. 1 along the A-A direction consistent with various disclosed embodiments in the present disclosure.

As illustrated in FIG. 15, the plurality of second-connecting-posts 51 on the first bare chip 41 and on the second bare chip 42 may be wired out through the connecting part 61, to achieve an electrical connection to the external circuits such as PCB boards. When a number of the plurality of second-connecting-posts 51 and a number of the first-connecting-posts 50 are large, a number of the metal layers may be increased according to actual needs if two metal layers (the first metal layer 20 and the second metal layer 30) cannot meet wiring requirements for all of the connecting posts.

In the present embodiment, the at least one first capacitor polar plate 21, the at least one second capacitor polar plate 31, the at least one third capacitor polar plate 70, and the at least one fourth capacitor polar plate 71 may be disposed in different layers. The chip package structure may have four or more metal layers, to meet a requirement of complex wires in the chip package structure. Methods and materials to form the different metal layers may be same or different according to actual needs.

As illustrated in FIG. 14, in one embodiment, the fourth capacitor polar plate 71 may be electrically connected to the second capacitor polar plate 31. If the first capacitor polar plate 21 may be electrically connected to the third capacitor polar plate 70, only two first-connecting-posts 50 may be necessary for providing signals to the four capacitor polar plates. A number of the connecting parts 61 may be reduced and the assembly of the chip package structure and the external circuits such as the PCB boards may be simplified. In some other embodiments, the third capacitor polar plate 70 may be wired out through the connecting parts 61 like the first wire 23 in FIG. 4.

The third capacitor polar plate 70 and the fourth capacitor polar plate 71 may be disposed at positions in the chip package structure according to actual needs. In one embodiment, the fourth capacitor polar plate 71 may be disposed at a side of the third capacitor polar plate 70 away from the plurality of bare chips 40. In another embodiment, the fourth capacitor polar plate 71 may be disposed at another side of the third capacitor polar plate 70 close to the plurality of bare chips 40. The fourth capacitor polar plate 71 may be disposed between the first capacitor polar plate 21 and the second capacitor polar plate 31, or between the second capacitor polar plate 31 and the third capacitor polar plate 70, or between the first capacitor polar plate 21 and the encapsulating layer 10.

In one embodiment as illustrated in FIG. 1 and FIG. 15, a side surface of the encapsulating layer 10 away from the first metal layer 20 may be a first surface m1, a side surface of the bare chips 40 away from the first metal layer 20 may be a second surface m2. The chip package structure may further include a protective layer 80 covering the first surface m1 and the second surface m2.

In the present disclosure, the protective layer 80 may cover the first surface m1 of the encapsulating layer 10 and the second surface m2 of the bare chips 40, to protect the encapsulating layer 10 and the bare chips 40. Influence of the external oxygen and/or water on an electric performance of the bare chips 40 may be avoided.

In one embodiment, the protective layer 80 may be made of a material same as the encapsulating layer 10 including EMC. Correspondingly, the protective layer 80 and the encapsulating layer 10 may be both formed by injecting mold method. The chip package process may be simplified and the production efficiency of the electronic products may be improved. In some other embodiment, the protective layer 80 may be made of other materials with a good sealing performance.

Figure 16:
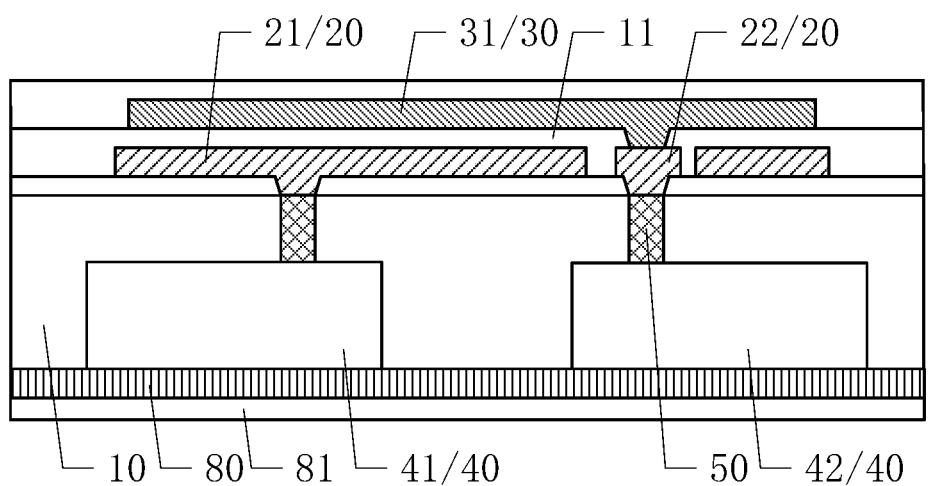
FIG. 16 illustrates another cross-section view of the chip package structure in FIG. 1 along the A-A direction consistent with various disclosed embodiments in the present disclosure.

In one embodiment illustrated in FIG. 1 and FIG. 16, the chip package structure may further include a flexible substrate 81 at a side of the protective layer 80 away from the first metal layer 20. Correspondingly, the whole chip package structure may be packaged at the panel level on the flexible substrate 81. Protection on a side of the bare chips 40 away from the first metal layer 20 after reversing the chips where all packaging process is not completed may be avoided. The efficiency of the chip package process and the good product ratio of the electronic products may be improved. The protective layer 80 may be made of materials with a high temperature resistance and a high sealing performance including silicide. Correspondingly, the protective layer 80 may block a high temperature when forming the encapsulating layer 10 by the injecting mold process and protect the flexible substrate 81 effectively. Also external oxygen and water may be prevented from entering the chip package structure through the flexible substrate 81. The performance of the chip package structure may be more stable.

The flexible substrate 81 may be made of a material including polyimide, polypropylene resin, and/or acrylic resin, to make the chip package structure flexible.

The present disclosure also provides a chip package method. As illustrated in FIG. 1, FIG. 2, and FIGS. 17-23, the chip package method may include:

Step 101: providing a substrate 90;

Step 102: providing a plurality of bare chips 40 attached to the substrate 90 and first-connecting posts 50 on the plurality of bare chips 40;

Step 103: forming an encapsulating layer 10;

Step 104: polishing the encapsulating layer 10;

Step 105: forming a first metal layer 20;

Step 106: forming a second metal layer 30 on a side of the first metal layer 20 away from the encapsulating layer 10; and Step 107: lifting off the substrate 90.

The substrate 90 may temporally support the chip package structure to be formed. Before attaching the plurality of bare chips to the substrate 90, alignment blocks or alignment marks may be formed on the substrate 90, to guarantee that each of the plurality of bare chips 40 can be aligned precisely when attaching the plurality of bare chips 40 attached to the substrate 90.

The plurality of bare chips 40 may include at least one first bare chip 41 and at least one second bare chip 42. The first-connecting posts 50 may include a first first-connecting post 50 at a side of each of the at least one first bare chip 41 and a second first-connecting post 50 at a side of each of the at least second bare chip 42. In Step 103, the encapsulating layer 10 may be formed to cover the plurality of bare chips 40 and the first-connecting posts 50. In Step 104, the encapsulating layer 10 may be polished to expose a side of the first-connecting-posts 50 away from the plurality of bare chips 40. In Step 105, the first metal layer 20 may be formed at the side of the first-connecting-posts 50 away from the plurality of bare chips 40. The first metal layer 20 may include at least one first capacitor polar plate 21 and at least one conductive part 22. The at least one first capacitor polar plate 21 may be electrically connected to the first first-connecting post 50 on the at least one first bare chip 41, and the at least one conductive part 22 may be electrically connected to the second first-connecting post 50 on the at least one second bare chip 42. In Step 106, the second metal layer 30 may include at least one second capacitor polar plate 31. The at least one second capacitor polar plate 31 may be electrically connected to the at least one conductive part 22. Along a direction perpendicular to a plane of the plurality of bare chips 40, an orthographic projection of the at least one first capacitor polar plate 21 may overlap an orthographic projection of the at least one second capacitor polar plate 31.

The first metal layer 20 and the second metal layer 30 may be formed on the encapsulating layer 10 sequentially. An interlayer insulation between the first metal layer 20 and the second metal layer 30, and an interlayer insulation between the first metal layer 20 and the encapsulating layer 10 may be achieved by an insulating layer 11. In the first metal layer 20, the at least one first capacitor polar plate 21 may be electrically connected to the first first-connecting post 50 on the at least one first bare chip 41, and the at least one conductive part 22 may be electrically connected to the second first-connecting post 50 on the at least one second bare chip 41. Correspondingly, the at least one first capacitor polar plate 21 and the at least one second capacitor polar plate 31 may be electrically connected to two bare chips 40 through the first-connecting-posts 50 respectively.

The orthographic projection of the at least one first capacitor polar plate 21 may overlap the orthographic projection of the at least one second capacitor polar plate 31 along the direction perpendicular to a plane of the plurality of bare chips 40. Correspondingly, the first capacitor polar plate 21, the second capacitor polar plate 31, and a portion of the insulating layer 11 between the first capacitor polar plate 21 and the second capacitor polar plate 31 may together form a capacitor structure C. Correspondingly, the chip package structure may have functions including voltage stabilization, voltage boosting, filtering, charging/discharging, rectification, and/or oscillation. Compared with current technologies where chips and capacitors are soldered to external circuits such as the PCB boards by the implanted balls or capacitors are formed by an external connection method, a length of wires between the chips and the capacitors in the chip package structure provided by the present disclosure may be reduced and the power consumption of the electronic products may be suppressed. The integration level of the chip package structure may be improved, and an assembly of the chip package structure and the external circuits such as PCB boards may be simplified. The plurality of bare chips 40 may be integrated together to achieve functions of chips and capacitors simultaneously. A product cost may be reduced and a good product ratio may be improved.

In the first metal layer 20, the at least one first capacitor polar plate 21 and the at least one conductive part 22 may be electrically connected to the first-connecting-posts 50. Before forming the first metal layer, the encapsulating layer 10 may be polished. The encapsulating layer 10 may have a better flatness and the formed first metal layer 20 may be hard to break. Also the side of the first-connecting-posts 50 away from the plurality of bare chips 40 may be exposed by the polishing process. Correspondingly, between the first metal layer 20 and the first-connecting-posts 50, a connecting strength may be improved and a connecting reliability may be guaranteed. In some other embodiments, the polish process for the first metal layer 20 may be substituted by some other processes including an etching process.

Figure 17:
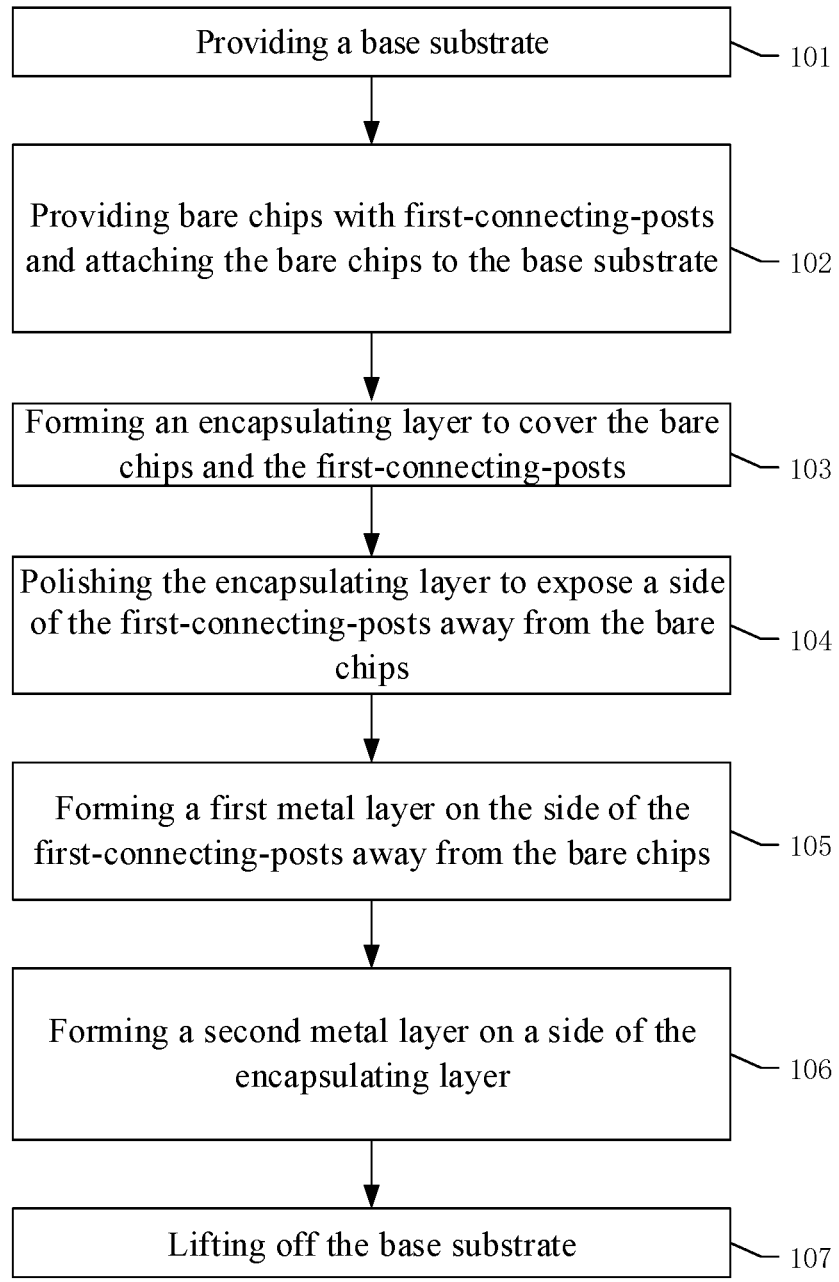
FIG. 17 illustrates an exemplary chip package method consistent with various disclosed embodiments in the present disclosure.
Figure 18:
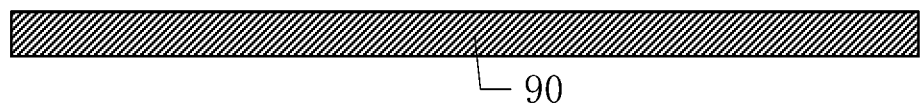
FIGS. 18-23 illustrate cross-section views of an exemplary chip package structure corresponding to different steps of the chip package method in FIG. 17 consistent with various disclosed embodiments in the present disclosure.
Figure 19:
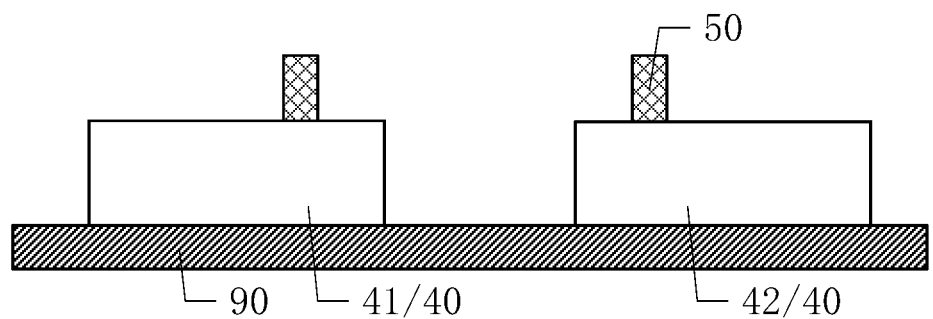
Figure 20:
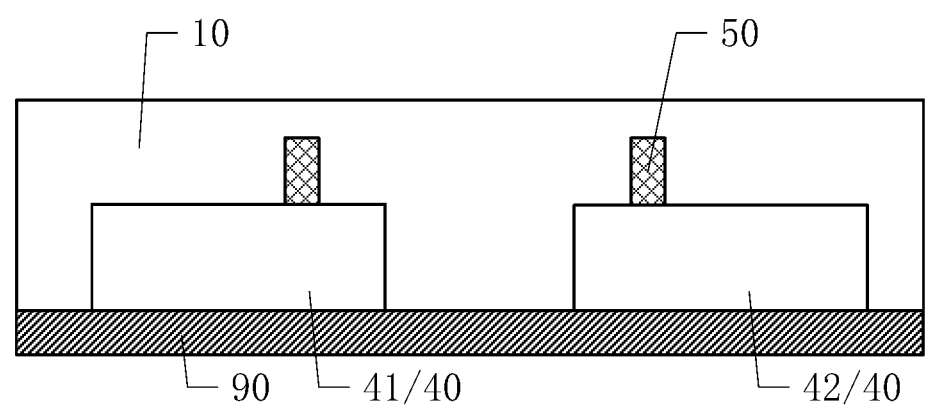
Figure 21:
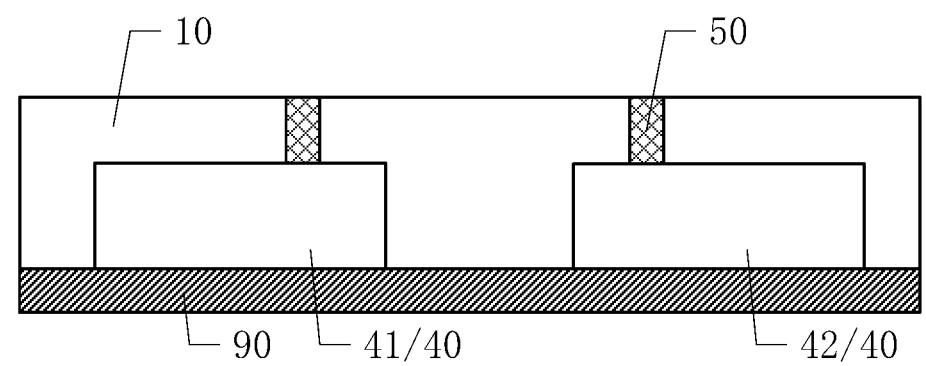
Figure 22:
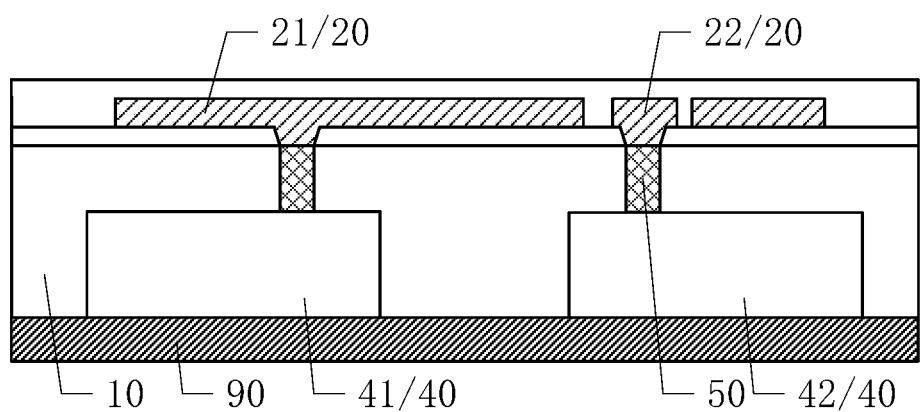

In one embodiment illustrated in FIG. 2, FIG. 17 and FIG. 19, the base substrate 90 may be a glass substrate or a silicon substrate, to meet requirements of different package processes.

In one embodiment, the base substrate 90 may be a glass substrate. The glass substrate may be a rectangle, and the plurality of bare chips 40 may be arranged on the glass substrate appropriately to improve an utilization efficiency of the space on the glass substrate and to achieve a panel-level package of the plurality of bare chips 40. In another embodiment, the base substrate 90 may be a silicon substrate and the silicon substrate usually is circular. The plurality of bare chips 40 may be arranged on the silicon substrate appropriately to achieve a wafer-level package of the plurality of bare chips 40.

Figure 23:
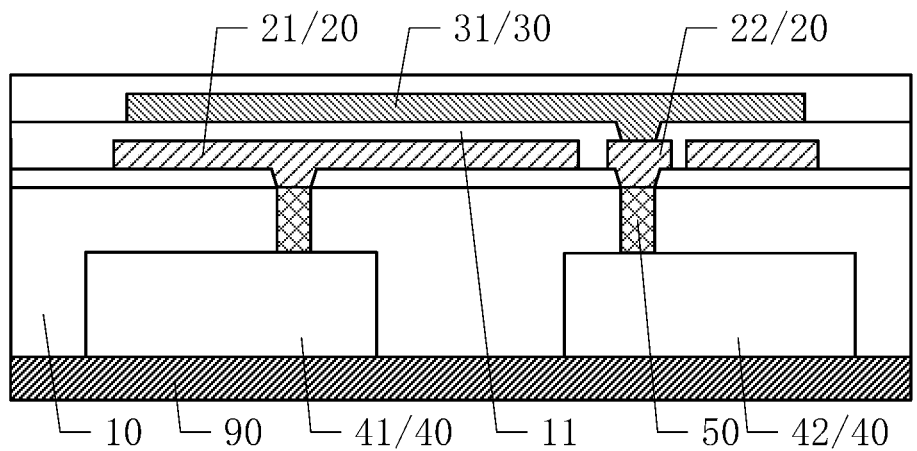

In one embodiment illustrated in FIG. 2, FIG. 17 and FIG. 23, in Step 107, the base substrate 90 may be lifted off by a laser irradiation method. This is, a laser lift-off (LLO) process may be used to separate the base substrate 90 from the surface of the encapsulating layer 10 and the plurality of bare chips 40. The separation process may be simplified and a packaging efficiency may be improved. The base substrate 90 separated from the surface of the encapsulating layer 10 and the plurality of bare chips 40 may be used repeatedly. A cost of the chip package process may be reduced.

In one embodiment illustrated in FIG. 2, FIG. 17 and FIGS. 22-23, the first metal layer 20 and the second metal layer 30 may be formed by an electrical plating process or a chemical plating process.

By forming the first metal layer 20 and the second metal layer 30 using an electrical plating process or a chemical plating process, the chip package process may be simplified further, and an accuracy of wire patterns in each metal layer may be guaranteed. Correspondingly, the efficiency of the chip package process may be improved. Before the electrical plating process or the chemical plating process, a metal seed layer with a thickness of about 0.01 µm to about 2 µm may be formed at a position corresponding to each metal layer. The first metal layer 20 may be formed by: depositing a metal seed layer with a corresponding thickness by a physical vapor deposition process before Step 105; coating the metal seed layer with a photoresist; etching the photoresist by a lithography process to expose the preformed wire patterns of the at least one first capacitor polar plate 21 and the at least one conductive part 22 which may be used as electrodes for the subsequent electrical plating process; forming the at least one first capacitor polar plate 21 and the at least one conductive part 22 on the exposed wire patterns by an electrical plating process or a chemical plating process; and removing the photoresist and the metal seed layer covered by the photoresist.

The metal seed layer may provide a good conductive layer basis for subsequently forming the at least one first capacitor polar plate 21 and the at least one conductive part 22. An accuracy of the electrical plating process or the chemical plating process may be improved further. The metal seed layer may be a single layer structure or a multilayer structure, and may be made of copper, titanium, iron, nickel, or any combinations thereof.

Figure 24:
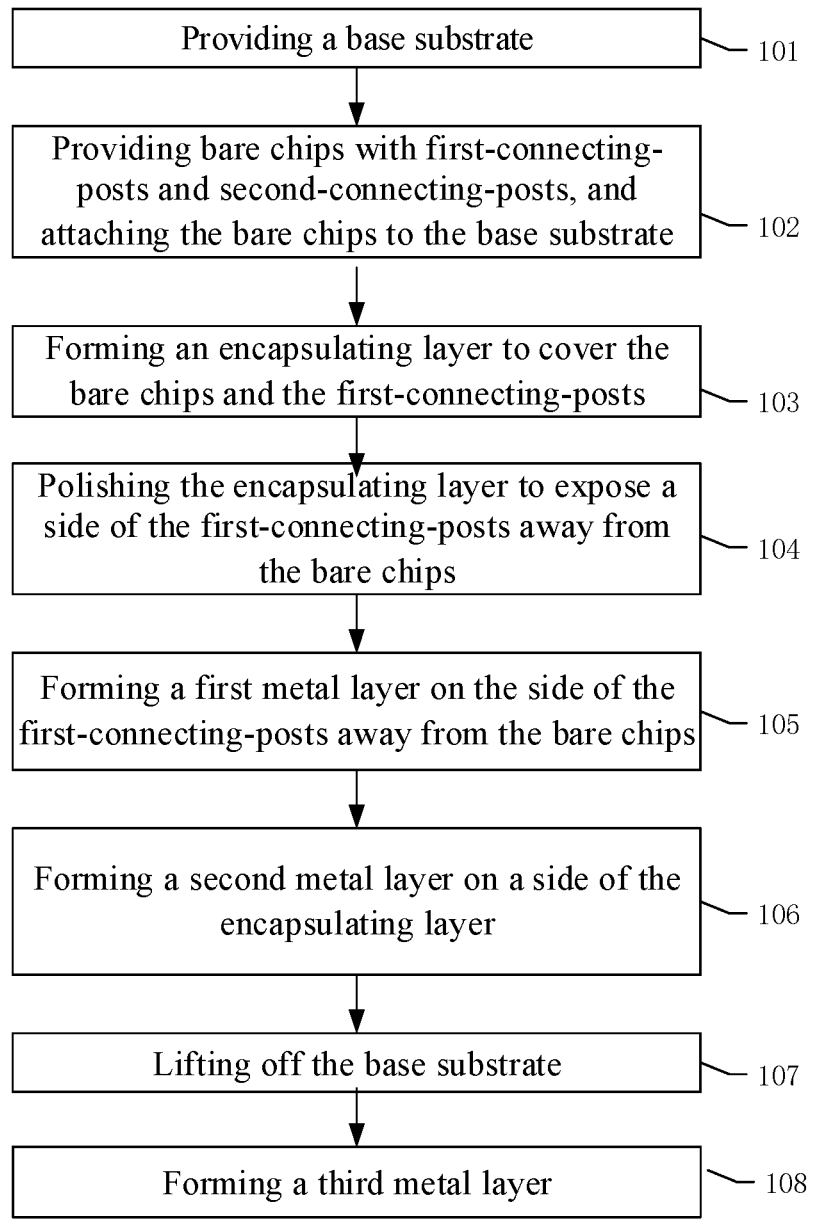
FIG. 24 illustrates another exemplary chip package method consistent with various disclosed embodiments in the present disclosure.
Figure 25:
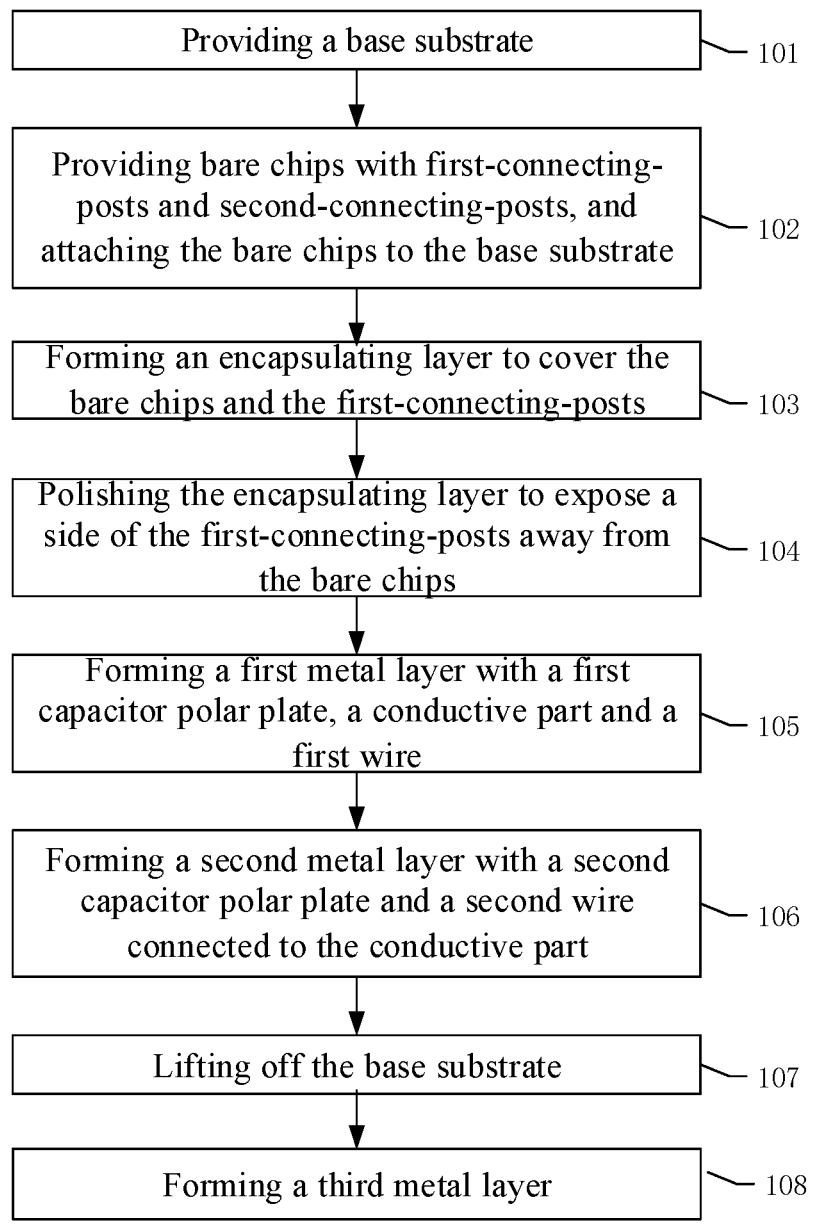
FIG. 25 illustrates another exemplary chip package method consistent with various disclosed embodiments in the present disclosure.
Figure 26:
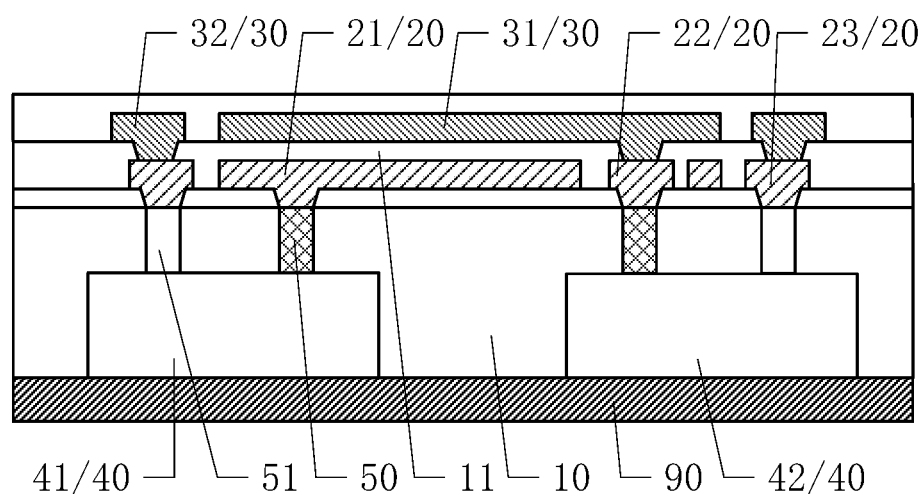
FIG. 26 illustrates a cross-section view of an exemplary chip package structure corresponding to the chip package method in FIG. 25 consistent with various disclosed embodiments in the present disclosure.

In one embodiment illustrated in FIG. 1, FIG. 4 and FIG. 24, when providing the plurality of bare chips 40 in Step 102, a plurality of second-connecting-posts 51 may be formed at a side of the at least one first bare chip 41 and/or at a side of the at least one second bare chip 42. The first metal layer 20 may further include at least one first wire 23 when forming the first metal layer 20 at the side of the first-connecting-posts 50 away from the plurality of bare chips 40 in Step 105.

Correspondingly, the chip package method may further include Step 108: forming a third metal layer 60 at a side of the second metal layer 30 away from the first metal layer 20. The third metal layer 60 may include at least one connecting part 61. The at least one connecting part 61 may be electrically connected to the at least one first wire 23 and the at least one first wire 23 may be electrically connected to the plurality of second-connecting-posts 51.

In one embodiment, the third metal layer 60 may be disposed at the side of the second metal layer 30 away from the first metal layer 20. When forming the third metal layer 60, Step 108 may be performed after Step 107, and the chip package structure achieved by Step 107 is illustrated in FIG. 2. Subsequently, the third metal layer 60 may be formed based on the second metal layer 30 and the derived chip package structure is illustrated in FIG. 4. In some other embodiments, when forming the third metal layer 60, Step 108 may be performed before Step 107. The base substrate 90 may be lifted off after forming the third metal layer 60. For description purposes only, the embodiment shown in FIG. 24 where Step 108 is performed after Step 107 is used as an example to illustrate the present disclosure and should not limit the scopes of the present disclosure.

In various embodiments, the third metal layer 60 may be formed by a method same as or different from a method for forming the second metal layer 30 and the first metal layer 20, as long as an electrical connection between the at least one connecting part 61 and the at least one metal wire 23 is guaranteed. Correspondingly, the plurality of second-connecting-posts 52 on the at least one first bare chip 41 and on the at least one second bare chip 42 may be wired out through the at least one connecting part 61, to achieve an electrical connection to the external circuits such as the PCB boards.

In various embodiments, the at least one connecting part 61 may include either one of a soldering ball and a soldering block. When the at least one connecting part 61 is a soldering ball, the third metal layer 60 may be made by a ball implantation process. When the at least one connecting part 61 is a soldering block, the third metal layer 60 may be formed by an etching process. The third metal layer 60 may be made of metals including tin, lead, copper, silver, gold, and any alloy combination thereof.

In one embodiment illustrated in FIGS. 5-6 and FIGS. 25-26, in Step 106 for forming the second metal layer 30 on the side of the first metal layer 20 away from the encapsulating layer 10, the second metal layer 30 may further include at least one second wire 32. The at least one connecting part 61 may be electrically connected to the at least one second wire 32 and the at least one second wire 32 may be electrically connected to the at least one first wire 23. Correspondingly, when wiring out the plurality of second-connecting-posts 51 through the at least one connecting part 61, the at least one second wire 32 may be used as a transitional film layer between the at least one first wire 23 and the at least one connecting part 61. When forming the third metal layer 60 by the electrical plating or chemical plating method, a broken of the at least one connecting part 61 because of a large distance between different film layers may be effectively avoided, and a good product ratio of the chip package structure may be improved.

Figure 27:
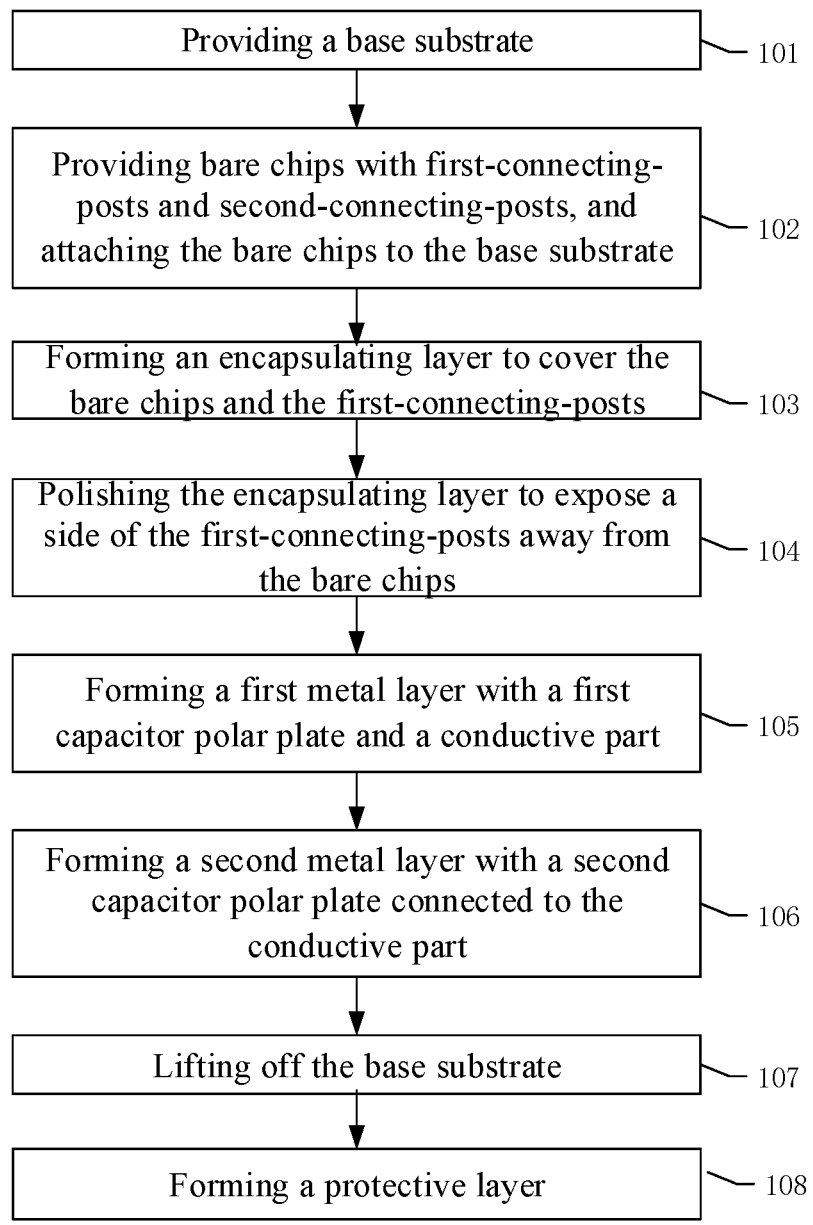
FIG. 27 illustrates another exemplary chip package method consistent with various disclosed embodiments in the present disclosure.
Figure 28:
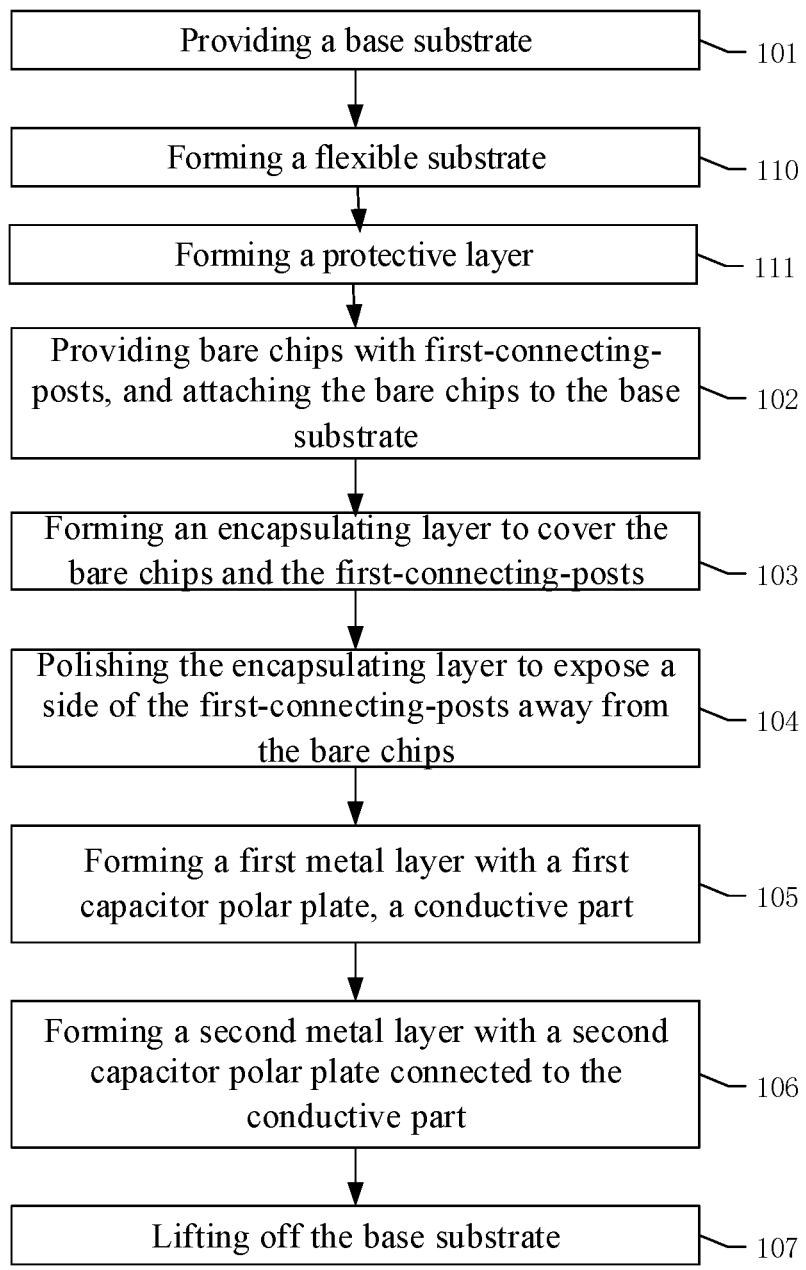
FIG. 28 illustrates another exemplary chip package method consistent with various disclosed embodiments in the present disclosure.
Figure 29:
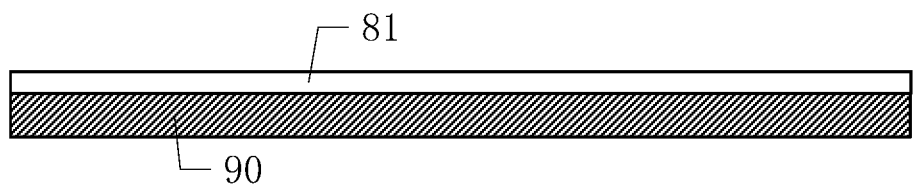
FIGS. 29-32 illustrate cross-section views of an exemplary chip package structure corresponding to different steps of the chip package method in FIG. 28 consistent with various disclosed embodiments in the present disclosure.
Figure 30:
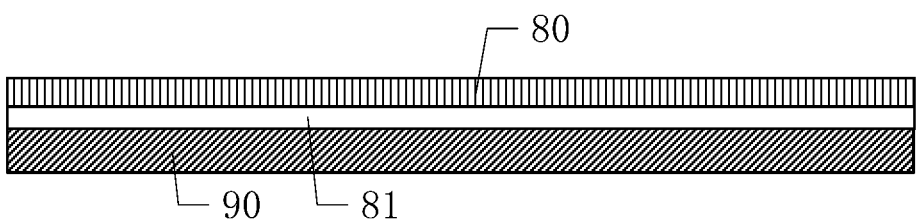
Figure 31:
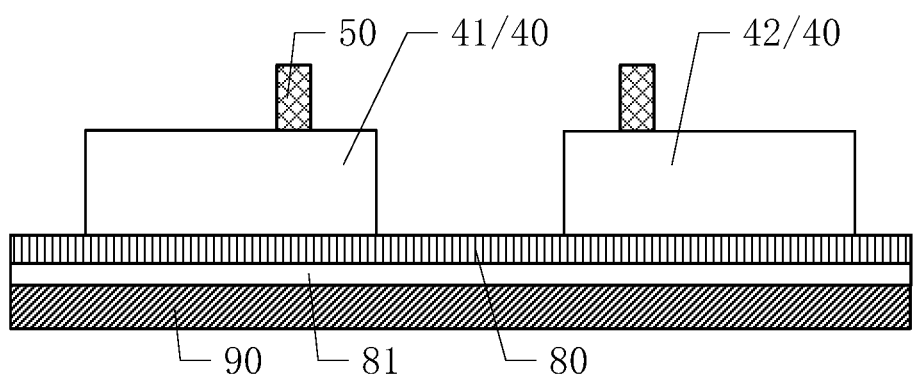
Figure 32:
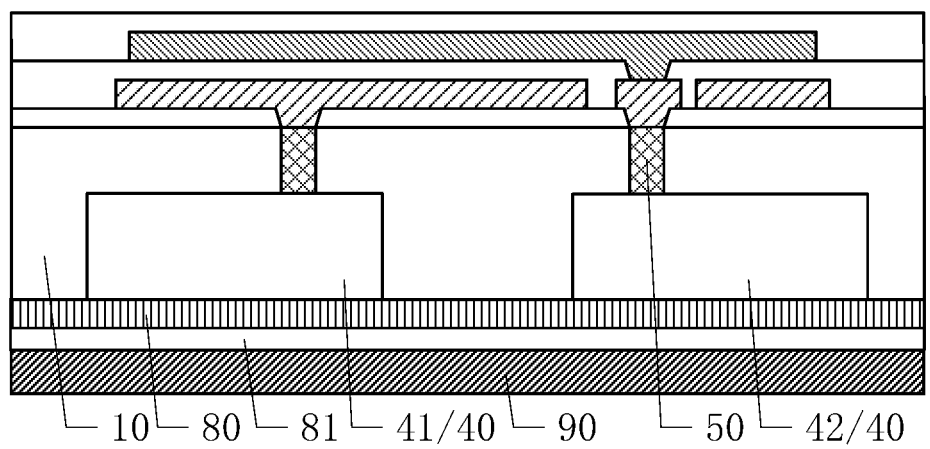

In one embodiment as illustrated in FIG. 1, FIG. 14 and FIG. 27, a side surface of the encapsulating layer 10 away from the first metal layer 20 may be a first surface m1, a side surface of the bare chips 40 away from the first metal layer 20 may be a second surface m2. After Step 107 for lifting off the base substrate 90, the chip package method may further include Step 109: forming a protective layer 80 to cover the first surface m1 and the second surface m2.

In the present disclosure, the protective layer 80 formed in Step 109 and the encapsulating layer 10 may together protect the plurality of bare chips 40. An influence of the external oxygen and/or water on an electric performance of the plurality of bare chips 40 may be avoided.

In various embodiments, the protective layer 80 may be made of a material according to actual needs. In one embodiment, the protective layer 80 and the encapsulating layer 10 may be made of EMC. Correspondingly, the protective layer 80 and the encapsulating layer 10 may be both formed by injecting mold method. The chip package process may be simplified and the production efficiency of the electronic products may be improved. Since the protective layer 80 may cover the first surface m1 of the encapsulating layer 10 and the second surface m2 of the plurality of bare chips 40, Step 109 may be performed after removing the base substrate 90 on the first surface m1 and the second surface m2.

In one embodiment illustrated in FIG. 1, FIG. 15 and FIGS. 28-32, before Step 102 for providing the plurality of bare chips 40, the chip package method may further include: Step 110: forming a flexible substrate 81 on the base substrate; and Step 111: forming the protective layer 80 on the flexible substrate 81. In Step 102, after providing the plurality of bare chips 40, the plurality of bare chips 40 may be attached to the protective layer 80.

In the present disclosure, the flexible substrate 81 and the protective layer 80 may be formed before attaching the plurality of bare chips 40. The flexible substrate 81 may be made of a material including (but not limited by) polyimide, polypropylene resin, and/or acrylic resin, to make the chip package structure flexible. Correspondingly, the whole chip package structure may be packaged at the panel level on the flexible substrate 81 and the base substrate 90 may be lifted off more easily. A space utilization efficiency and then an integration level of the chip package structure may be improved. The protective layer 80 may be made of materials with a high temperature resistance and a high sealing performance including silicide. Correspondingly, the protective layer 80 may block a high temperature when forming the encapsulating layer 10 by the injecting mold process and protect the flexible substrate 81 effectively. Also external oxygen and water may be prevented from entering the chip package structure through the flexible substrate 81. The performance of the chip package structure may be more stable.

In Step 107, the base substrate 90 may be lifted off from the flexible substrate 81. A damage on the plurality of bare chips 40 when lifting off the base substrate 90 may be avoided, and an electric performance of the plurality of bare chips may be guaranteed.

In the present disclosure, the chip package structure may include the at least one first capacitor polar plate and the at least one second capacitor polar plate. The orthographic projection of the at least one first capacitor polar plate may overlap the orthographic projection of the at least one second capacitor polar plate, to form the capacitor structure. The at least one first capacitor polar plate and the at least one second capacitor polar plate may be formed when packaging the plurality of bare chips, and the capacitor structure and the plurality of bare chips may be packaged together. The assembly of the chip package structure may be simplified and the production efficiency of the electronic products may be improved. The capacitor structure may be disposed between the at least one first bare chip and the at least one second bare chips. Correspondingly, a space between a space of the bare chips and a space between the bare chips may be utilized effectively. The integration level of the chip package structure may be improved. The bare chips may provide signals to the capacitor structure through the first-connecting-posts without external capacitors, and there may be no need to wire out the capacitor structure by a ball implantation method. The chip package structure may have one or more functions of voltage stabilization, voltage boosting, filtering, charging/discharging, rectification, and oscillation. The first-connecting-posts on the bare chips may use the electrical fan-out wiring method. An effective connection between the first capacitor polar plate, the second capacitor polar plate, and the first-connecting-posts may be guaranteed. The reliability and the good product ratio of the chip package structure may be improved. The packaging process may be simplified and the cost of the electronic products may be reduced compared with a connection method where each chip is independently packaged and connected to an external capacitor.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments but may be embodied in other equivalent forms without departing from the scope of the present disclosure, which is determined by the appended claims.

What is claimed is:

1. A chip package structure, comprising an encapsulating layer, a first metal layer, a second metal layer and a plurality of bare chips, wherein:
the plurality of bare chips includes at least one first bare chip and at least one second bare chip;
first-connecting-posts are disposed on a side of the plurality of bare chips, wherein the first connecting-posts include at least one first first-connecting-post on a side of the at least one first bare chip and at least one second first-connecting-post on a side of the at least one second bare chip;

the encapsulating layer covers the plurality of bare chips and the first-connecting-posts, and exposes a side of the first-connecting-posts away from the plurality of bare chips;

the first metal layer is disposed on the side of the first-connecting-posts away from the plurality of the bare chips, and includes at least one first capacitor polar plate and at least one conductive part;

the at least one first capacitor polar plate is electrically connected to the at least one first first-connecting-post on the at least one first bare chip, and the at least one conductive part is electrically connected to the at least one second first-connecting-post on the at least one second bare chip;

the second metal layer is disposed on a side of the first metal layer away from the encapsulating layer, and includes at least one second capacitor polar plate electrically connected to the at least one conductive part; and along a direction perpendicular to a plane of the plurality of bare chips, an orthographic projection of the at least one first capacitor polar plate at least partially overlaps an orthographic projection of the at least one second capacitor polar plate.

2. The structure according to claim 1, further including a third metal layer, wherein:
a plurality of second-connecting-posts is formed on a side of the at least one first bare chip and on a side of the at least one second bare chip;
the first metal layer further includes at least one first wire;
the third metal layer is disposed on a side of the second metal layer away from the first metal layer, and includes at least one connecting part;
the at least one connecting part is electrically connected to the at least one first wire; and
the at least one first wire is electrically connected to the plurality of second-connecting-posts.

3. The structure according to claim 2, wherein:
the second metal layer further includes at least one second wire;
the at least one connecting part is electrically connected to the at least one second wire; and
the at least one second wire is electrically connected to the at least one first wire.

4. The structure according to claim 2, wherein:
the at least one connecting part is one of a soldering ball and a soldering block.

5. The structure according to claim 1, wherein:
the second metal layer includes at least two second capacitor polar plates; and
along the direction perpendicular to a plane of the plurality of bare chips, an orthographic projection of each of the at least two second capacitor polar plates at least partially overlaps an orthographic projection of a same first capacitor polar plates.

6. The structure according to claim 1, further including at least one third capacitor polar plate and at least one fourth capacitor polar plate, wherein:
the at least one third capacitor polar plate and the at least one fourth capacitor polar plate are disposed in different layers;
the at least one third capacitor polar plate and the at least one first capacitor polar plate are electrically connected to each other and are disposed in different layers; and
along the direction perpendicular to a plane of the plurality of bare chips, an orthographic projection of the at least one third capacitor polar plate at least partially overlaps an orthographic projection of the at least one fourth capacitor polar plate.

7. The structure according to claim 6, wherein:
the at least one third capacitor polar plate and the at least one second capacitor polar plate are disposed in a same layer; and
the at least one fourth capacitor polar plate and the at least one first capacitor polar plate are disposed in a same layer.

8. The structure according to claim 6, wherein:
the at least one first capacitor polar plate, the at least one second capacitor polar plate, the at least one third capacitor polar plate and the at least one fourth capacitor polar plate are disposed in different layers; and
the at least one fourth capacitor polar plate is electrically connected to the at least one first capacitor polar plate.

9. The structure according to claim 1, further including a protective layer, wherein:
a side surface of the encapsulating layer away from the first metal layer is a first surface;
a side surface of the plurality of bare chips away from the first metal layer is a second surface; and
the protective layer covers the first surface and the second surface.

10. The structure according to claim 9, further including a flexible substrate disposed at a side of the protective layer away from the first metal layer.

11. A chip package method, comprising:
providing a base substrate;
providing a plurality of bare chips attached to the base substrate and including at least one first bare chip and at least one second bare chip;
forming first-connecting-posts on a side of the plurality of bare chips, wherein the first-connecting-posts include at least one first first-connecting-post on a side of the at least one first bare chip and at least one second first-connecting-post on a side of the at least one second bare chips;
forming an encapsulating layer to cover the plurality of bare chips and the first-connecting-posts;
polishing the encapsulating layer to expose a side of the first-connecting-posts away from the plurality of bare chips;
forming a first metal layer on the side of the first-connecting-posts away from the plurality of bare chips, wherein the first metal layer includes at least one first capacitor polar plate and at least one conductive part;
the at least one first capacitor polar plate is electrically connected to the at least one first first-connecting-post on the at least one first bare chip and the at least one conductive part is electrically connected to the at least one second first-connecting-post on the at least one second bare chip;
forming a second metal layer on a side of the first metal layer away from the encapsulating layer, wherein the second metal layer includes at least one second capacitor polar plate electrically connected to the at least one conductive part; and along a direction perpendicular to a plane of the plurality of bare chips, an orthographic projection of the at least one first capacitor polar plate at least partially overlaps an orthographic projection of the at least one second capacitor polar plate; and
lifting off the base substrate.

12. The method according to claim 11, wherein:
a plurality of second-connecting-posts is formed on a side of the at least one first bare chip and/or on a side of the at least one second bare chip;

the first metal layer formed on the side of the first-connecting-posts away from the plurality of bare chips further includes at least one first wire;

the third metal layer is disposed on a side of the second metal layer away from the first metal layer, and includes at least one connecting part;

the at least one connecting part is electrically connected to the at least one first wire; and the at least one first wire is electrically connected to the plurality of second-connecting-posts.

13. The method according to claim 12, wherein:

the second metal layer on the side of the first metal layer away from the encapsulating layer further includes at least one second wire;

the at least one connecting part is electrically connected to the at least one second wire; and the at least one second wire is electrically connected to the at least one first wire.

14. The method according to claim 11, wherein:

a surface of a side of the encapsulating layer away from the first metal layer is a first surface;

a surface of the plurality of bare chips away from the first metal layer is a second surface; and after lifting off the base substrate, the method further includes forming a protective layer covering the first surface and the second surface.

15. The method according to claim 11, wherein:

before providing the plurality of bare chips, the method further includes forming a flexible substrate on the base substrate and forming a protective layer on the flexible substrate; and after providing the plurality of bare chips, the plurality of bare chips is attached to the protective layer.

16. The method according to claim 11, wherein the base substrate is a glass substrate or a silicon substrate.

17. The method according to claim 11, wherein:

the base substrate is lifted off by a laser irradiation process.

18. The method according to claim 11, wherein:

the first metal layer and the second metal layer are formed by an electrical plating method or a chemical plating method.

* * * * *